(12) United States Patent
Mogi et al.

(10) Patent No.: US 8,593,321 B2
(45) Date of Patent: Nov. 26, 2013

(54) COMPUTATION APPARATUS AND METHOD, QUANTIZATION APPARATUS AND METHOD, AND PROGRAM

(75) Inventors: Yukihiko Mogi, Kanagawa (JP); Masato Kamata, Tokyo (JP)

(73) Assignee: Sony Corporation, Tokyo (JP)

( * ) Notice: Subject to any disclaimer, the term of this patent is extended or adjusted under 35 U.S.C. 154(b) by 221 days.

(21) Appl. No.: 12/563,413

(22) Filed: Sep. 21, 2009

(65) Prior Publication Data

US 2010/0082589 A1    Apr. 1, 2010

(30) Foreign Application Priority Data

Sep. 26, 2008    (JP) .................................. 2008-247683

(51) Int. Cl.
*H03M 1/12*    (2006.01)
(52) U.S. Cl.
USPC .................... 341/155; 707/747; 707/E17.052
(58) Field of Classification Search
USPC .................. 704/500–504; 707/706, E17.014, 707/999.002; 708/203, 207
See application file for complete search history.

(56) References Cited

U.S. PATENT DOCUMENTS

| | | | |
|---|---|---|---|
| 5,327,520 A | 7/1994 | Chen | |
| 5,946,652 A * | 8/1999 | Heddle | 704/230 |
| 6,246,979 B1 | 6/2001 | Carl | |
| 6,597,815 B1 | 7/2003 | Satoh et al. | |
| 6,971,013 B2 * | 11/2005 | Mihcak et al. | 713/180 |
| 7,738,454 B1 * | 6/2010 | Panwar et al. | 370/389 |
| 2001/0050959 A1 * | 12/2001 | Nishio et al. | 375/243 |
| 2003/0118243 A1 * | 6/2003 | Sezer et al. | 382/245 |
| 2005/0063471 A1 | 3/2005 | Regunathan et al. | |
| 2005/0069214 A1 | 3/2005 | Hayashi et al. | |
| 2005/0097312 A1 * | 5/2005 | Mihcak et al. | 713/150 |
| 2007/0094018 A1 | 4/2007 | Zinser et al. | |
| 2008/0065709 A1 * | 3/2008 | Hack | 708/204 |
| 2010/0063826 A1 | 3/2010 | Mogi et al. | |
| 2010/0082589 A1 * | 4/2010 | Mogi et al. | 707/706 |
| 2010/0082717 A1 | 4/2010 | Mogi et al. | |

FOREIGN PATENT DOCUMENTS

| | | |
|---|---|---|
| JP | 06-083400 A | 3/1994 |
| JP | 06-318154 A | 11/1994 |
| JP | 10-243028 A | 9/1998 |
| JP | 11-327600 A | 11/1999 |
| JP | 2000-047850 | 2/2000 |

(Continued)

OTHER PUBLICATIONS

Carrano et al., "Data Abstraction and Problem Solving with C++", Second Edition, Aug. 1998, pp. 51-53, 78-87, 402-403,598-613.*
Tomas Alexander, GPU Gems 3 Japanese edition first edition, Book, Born digital Co., Ltd., Aug. 15, 2008.

(Continued)

*Primary Examiner* — Ajay Bhatia
*Assistant Examiner* — Randall Burns
(74) *Attorney, Agent, or Firm* — Wolf, Greenfield & Sacks, P.C.

(57) ABSTRACT

A computation apparatus includes a range table creation unit configured to create a range table in which a discrete value of a computation result obtained by applying a nonlinear computation on an input value corresponds to a range of the input value which may take the discrete value, and a search unit configured to search, when the input value is input, in the range table, for the range in which the input value is included and output the discrete value corresponding to the searched range.

11 Claims, 15 Drawing Sheets

(56) References Cited

FOREIGN PATENT DOCUMENTS

| | | |
|---|---|---|
| JP | 2002-141805 A | 5/2002 |
| JP | 2002-300042 A | 10/2002 |
| JP | 2002-344316 A | 11/2002 |
| JP | 2004-226742 A | 8/2004 |
| JP | 2006-047561 A | 2/2006 |
| JP | 3877683 B2 | 11/2006 |
| JP | 2007-233554 A | 9/2007 |
| JP | 2008-191675 A | 8/2008 |

OTHER PUBLICATIONS

Toshikazu Tajimi, "Programming Technique 7", UNIX Magazine, Japan, ASCII Co., Ltd., May 1, 1998, vol. 13, No. 5.

Yasunari Fujita, "Development of the Multimedia Interactive Art Authoring Environment", Information Processing Society article magazine, Japan, Information Processing Society of Japan, Mar. 15, 1995, vol. 36 No. 3.

Junichi Aoe, "Key Search Technique—I", Information processing vol. 33 No. 11, Journal of Information Processing Society of Japan, Japan, Information Processing Society of Japan, vol. 33.

* cited by examiner

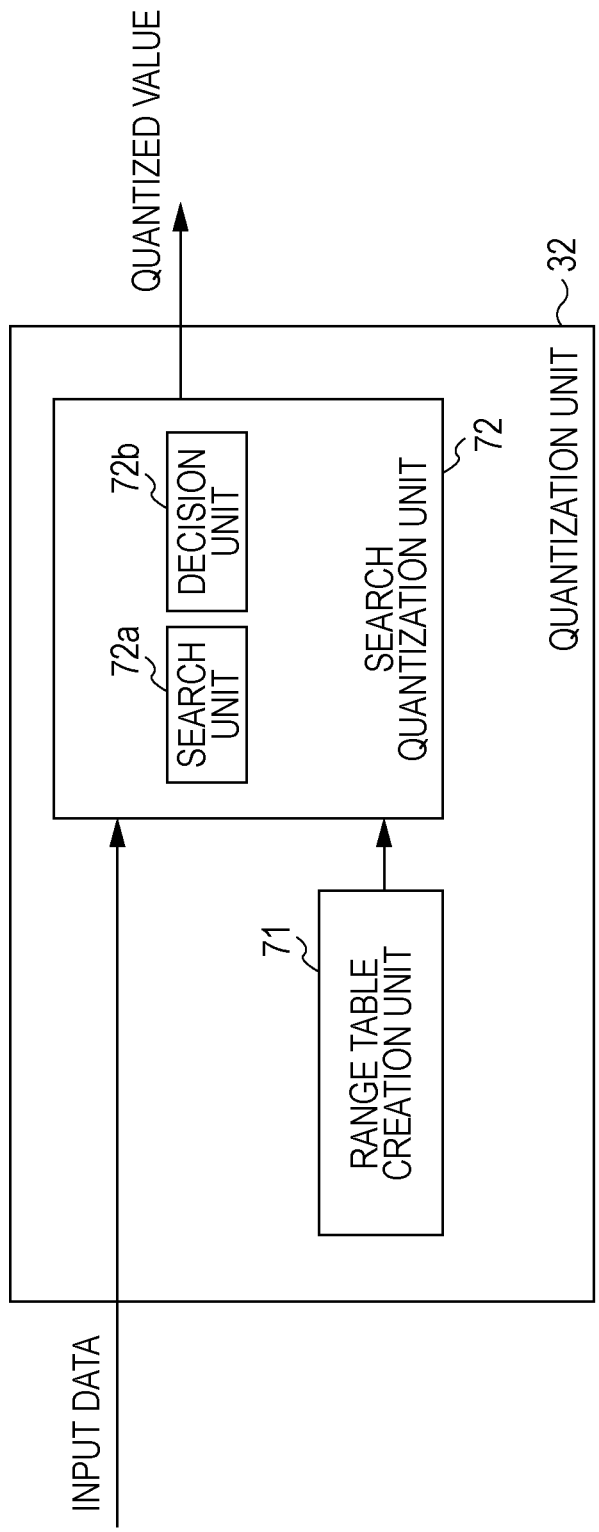

FIG. 3

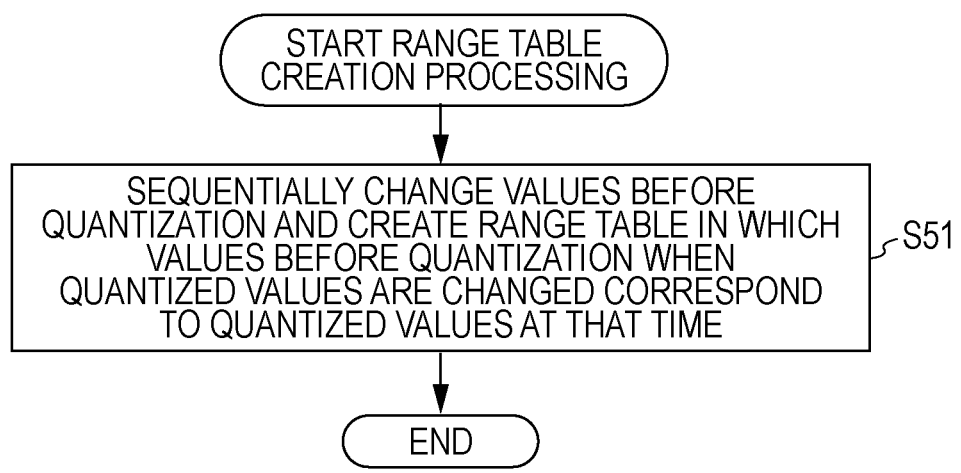

```
     START RANGE TABLE
    CREATION PROCESSING
            │
            ▼
┌─────────────────────────────────────┐
│ SEQUENTIALLY CHANGE VALUES BEFORE   │
│ QUANTIZATION AND CREATE RANGE TABLE │─ S51
│ IN WHICH VALUES BEFORE QUANTIZATION │
│ WHEN QUANTIZED VALUES ARE CHANGED   │
│ CORRESPOND TO QUANTIZED VALUES AT   │
│ THAT TIME                           │
└─────────────────────────────────────┘
            │
            ▼
          END
```

FIG. 4

| QUANTIZED VALUE Z | RANGE OF VALUE Y BEFORE QUANTIZATION |
|---|---|
| 0 | 4.9999600e−01F |
| 1 | 1.8629548e+00F |
| 2 | 3.5652816e+00F |
| 3 | 5.5063962e+00F |
| ⋮ | ⋮ |
| 8189 | 1.6507573e+05F |
| 8190 | 1.6510260e+05F |
| 8191 | 1.6512946e+05F |

FIG. 6

```
1       for (m = 0; m < data_size; m += 1)   {
2           if        (Y[m] < 4.9999600e−01F)  {
3               Z[m] =     0;
4           }
5           else if   (Y[m] < 1.8629548e+00F)  {
6               Z[m] =     1;
7           }
8           else if   (Y[m] < 3.5652816e+00F)  {
9               Z[m] =     2;
10          }
11          else if   (Y[m] < 5.5063962e+00F)  {
12              Z[m] =     3;
13          }
            ⋮
N−9         else if   (Y[m] < 1.6507573e+05F)  {
N−8             Z[m] = 8189;
N−7         }
N−6         else if   (Y[m] < 1.6510260e+05F)  {
N−5             Z[m] = 8190;
N−4         }
N−3         else if   (Y[m] < 1.6512946e+05F)  {
N−2             Z[m] = 8191;
N−1         }
N       }
```

```
1    short quantize_hash[20] [16]
2    ={   /*EXPONENT PART index1 = 0 */
3         {   0,    0,    0,    0,    0,    0,    0,    0,
4             0,    0,    0,    0,    0,    0,    0,    0,
5         }, /*EXPONENT PART index1 = 1 */
6         {   0,    0,    0,    0,    0,    0,    0,    0,
7             0,    0,    0,    0,    0,    0,    0,    0,
8         }, /*EXPONENT PART index1 = 2 */
9         {   0,    0,    0,    0,    0,    0,    0,    0,
10            0,    0,    0,    0,    0,    1,    1,    1,
11        }, /*EXPONENT PART index1 = 3 */
12        {   1,    1,    1,    1,    1,    1,    1,    1,
13            1,    1,    1,    1,    2,    2,    2,    2,
14        }, /*EXPONENT PART index1 = 4 */
15        {   2,    2,    2,    2,    2,    2,    3,    3,
16            3,    3,    3,    3,    3,    3,    4,    4,
17        }, /*EXPONENT PART index1 = 5 */
18        {   4,    4,    4,    5,    5,    5,    5,    5,
19            6,    6,    6,    6,    6,    7,    7,    7,
20        }, /*EXPONENT PART index1 = 6 */
21        {   7,    8,    8,    8,    9,    9,    9,   10,
22           10,   10,   11,   11,   11,   12,   12,   12,
23        }, /*EXPONENT PART index1 = 7 */
24        {  13,   14,   14,   15,   15,   16,   17,   17,
25           18,   18,   19,   19,   20,   20,   21,   22,
26        }, /*EXPONENT PART index1 = 8 */
27        {  23,   24,   25,   26,   27,   28,   29,   30,
28           31,   31,   32,   33,   34,   35,   36,   37,
29        }, /*EXPONENT PART index1 = 9 */
30        {  38,   40,   41,   43,   45,   47,   48,   50,
31           51,   53,   55,   56,   58,   59,   61,   62,
32        },
⋮
N-7          /*EXPONENT PART index1 = 18 */
N-6       {4096, 4286, 4474, 4659, 4842, 5023, 5201, 5377,
N-5        5552, 5724, 5895, 6064, 6232, 6398, 6563, 6726,
N-4       }, /*EXPONENT PART index1 = 19 */
N-3       {6889, 7209, 7525, 7836, 8143, 8143, 8143, 8143,
N-2        8143, 8143, 8143, 8143, 8143, 8143, 8143, 8143,
N-1       },
N      }
```

FIG. 13

```
1      float quantize_tab[8192]
2      = {
3          4.9999600e-01F,  /*    0 */
4          1.8629548e+00F,  /*    1 */
5          3.5652816e+00F,  /*    2 */
6          5.5063962e+00F,  /*    3 */
...
8192       1.6507573e+05F,  /* 8189 */
8193       1.6510260e+05F,  /* 8190 */
8194       1.6512946e+05F,  /* 8191 */
8195   };
8196       union {
8197           float f;
8198           int   i;
8199       } uni0;
8200       for (m = 0; m < data_size; m += 1) {
8201           uni0. f = Y[m];
8202           if      (uni0.f < 4.9999600e-01F) {
8203               k = 0;
8204           }
8205           else if (uni0. f < 1.8629548e+00F) {
8206               k = 1;
8207           }
8208           else if (uni0. f < 3.5652816e+00F) {
8209               k = 2;
8210           }
8211           else if (uni0. f < 5.5063962e+00F) {
8212               k = 3;
8213
8214           else if (uni0. f < 7.6383047e+00F)
8215               k = 4;
8216           }
8217           else {
8218           index1 = (uni0. i >> 23) - 125;               /* EXPONENT PART */
8219           index2 = (uni0. i & 0x007FFFFF) >> (23 - 4); /* SIGNIFICAND PART */
8220           k = quantize_hash[index1] [index2] ;
8221           for ( ; k < 8192; k++) {
8222               if (uni0. f < quantize_tab[k]) {
8223                   break;
8224               }
8225           }
8226           }
8227           Z[m] = k;
8228       }
```

FIG. 14

```
1      int quantize_tab_int[8192]
2      = {
3              128,       /*    0 */
4              486,       /*    1 */
5              913,       /*    2 */
6             1410,       /*    3 */
⋮
8192       42259386,      /* 8189 */
8193       42266266,      /* 8190 */
8194       42273142,      /* 8191 */
8195   };
8196   int yin;
8197   for (m = 0; m < data_size; m += 1) {
8198       yin = Y[m];
8199       if      (yin < 128) {
8200           k = 0;
8201       }
8202       else if (yin < 486) {
8203           k = 1;
8204       }
8205       else if (yin < 913) {
8206           k = 2;
8207       }
8208       else if (yin < 1410) {
8209           k = 3;
8210       }
8211       else if (yin < 1955) {
8212           k = 4;
8213       }
8214       else {
8215           mask = 0x40000000;
8216           for (cnt = 30; cnt >= 0; cnt--) {
8217               if ((yin & mask > 0) {
8218                   break;
8219               }
8220               mask = mask >> 1;
8221           }
8222           yin = yin - mask;
8223           index1 = cnt - 8 + 2;      /* EXPONENT PART */
8224           index2 = yin >> (cnt - 4); /* SIGNIFICAND PART */
8225           k = quantize_hash [index1] [index2] ;
8226           for ( ; k < 8192; k++) {
8227               if (yin  < quantize_tab_int[k]) {
8228                   break;
8229               }
8230           }
8231       }
8232       Z[m] = k;
8233   }
```

201

| METHOD | RATIO |
|---|---|
| METHOD IN RELATED ART | 1.00 |
| CONDITIONAL SENTENCE | 0.28 |
| HASH TABLE | 0.32 |
| COMBINATION OF CONDITIONAL SENTENCE AND HASH TABLE | 0.21 |

COMPUTATION APPARATUS AND METHOD, QUANTIZATION APPARATUS AND METHOD, AND PROGRAM

BACKGROUND OF THE INVENTION

1. Field of the Invention

The present invention relates to a computation apparatus and method, a quantization apparatus and method, and a program. In particular, the invention relates to a computation apparatus and method, a quantization apparatus and method, and a program with which a nonlinear computation can be efficiently performed.

2. Description of the Related Art

To deal with an analog signal in a digital signal processing, in addition to a sampling processing for performing a discretization on a domain of the signal, a quantization processing for performing a discretization on a range of the signal is carried out. Also, in a case where the digital signal already subjected to the discretization on the range is dealt with at a still smaller amount of data, a still rougher discretization is carried out in some cases, and this process is also included in the quantization processing. In the quantization processing, a value after the discretization is referred to as quantized value, and a code to which the quantized value is assigned is referred to as quantization code. Also, an interval between adjacent quantized values is referred to as quantization step width, and the number of the quantized values included in the range is referred to as the number of quantization steps.

On the other hand, in a case where the digital signal obtained as the result of the digital signal processing is output as an analog signal, for example, from the quantization code, a processing of reconstructing the original continuous values or the values subjected to the discretization at a small quantization step width is carried out. This process is referred to as inverse quantization processing. In the inverse quantization processing, the quantized values corresponding to the quantization code are converted through an inverse quantization conversion to reconstruct the original values.

At this time, the quantized values are obtained while the continuous values are approximate to the discrete values in the quantization processing, and accordingly errors between the reconstructed values through the inverse quantization processing (inverse quantized values) and the original values are generated through the quantization processing. Therefore, in the inverse quantization processing, the values before performing the quantization processing (values before the quantization) are not reconstructed in a completed manner, and the reconstructed inverse quantized values are approximate values including the quantization errors.

In general, in a case where the quantization step width is large, the quantization errors become large, but the number of the quantization steps becomes small. Thus, the data amount used for representing the quantization code becomes small. On the other hand, in a case where the quantization step width is small, the quantization errors become small, but the number of the quantization steps becomes large. Thus, the data amount used for representing the quantization code becomes large.

The quantization in which the quantization step width is constant is referred to as linear quantization. In contrast, the quantization in which the quantization step width is not constant is referred to as nonlinear quantization processing. As compared with the linear quantization processing, the nonlinear quantization processing has the following characteristics.

First, in a case where an appearance probability of the signals is biased, by carrying out a nonlinear quantization processing in which the quantization step width is set smaller in a vicinity of a value (signal) whose appearance probability is high and the quantization step width is set larger in a vicinity of a value (signal) whose appearance probability is low, it is possible to set the quantization errors smaller in average as compared with a linear quantization processing. Also, through a similar method, by adjusting the number of the quantization steps in accordance with the appearance probability of the signals, it is possible to reduce the data amount without deteriorating the average quantization errors as compared with the linear quantization processing.

Also, in particular, in the case of an audio signal or an image signal, while following characteristics of the acoustic sense and the visual sense, by setting the quantization step width smaller in a vicinity of a value to which human beings are sensuously responsive and the quantization step width larger in a vicinity of a value to which human beings are not sensuously responsive, it becomes difficult for the people to perceive the quantization errors as compared with the linear quantization processing. In addition, through a similar method, by adjusting the number of the quantization steps in accordance with the characteristics of the human sensory perception, as compared with the linear quantization processing, it is possible to reduce the data amount without deteriorating the errors perceived by the people.

Therefore, the nonlinear quantization processing is utilized in various fields dealing with the signals and the like conforming to the human sensuous characteristics such as the signal in which the appearance probability of the signals is biased, the audio signal, or the image signal.

Incidentally, for a system for coding the audio signal, an MPEG (Moving Picture Expert Group) audio standard is proposed. The MPEG audio standard includes a plurality of coding systems. In ISO/IEC (International Organization for Standardization/International Electrotechnical Commission) 13818-7, a coding system of MPEG-2 audio standard AAC (Advanced Audio Coding) is standardized.

Also, in the further expanded ISO/IEC 14496-3, a coding system of MPEG-4 audio standard AAC is standardized. It should be noted that hereinafter, the MPEG-2 audio standard AAC and the MPEG-4 audio standard AAC are collectively referred to as AAC standard.

An audio coding apparatus compliant with the AAC standard in a related art is provided with an auditory psychological model holding unit, a gain control unit, a spectrum processing unit, a quantization/coding unit, and a multiplexer unit.

In the auditory psychological model holding unit, the audio signal input to the audio coding apparatus is converted into blocks along the time axis and analyzed in conformity to the human auditory characteristics for each divided band so that a permissible error intensity of the respective divided bands is calculated.

Also, the input audio signal is divided into four frequency bands at regular intervals in the gain control unit, and a gain adjustment is performed on a predetermined band.

Furthermore, the audio signal after the gain adjustment is converted into spectrum data of the frequency domain in the spectrum processing unit, and a predetermined processing is applied on the basis of the permissible error intensity calculated by the auditory psychological model holding unit. Then, the spectrum data on which the predetermined processing is applied (the audio signal) is converted into a code string in the quantization/coding unit, and various types of information are multiplexed in the multiplexer unit to be output as a bit stream.

Incidentally, a decoding apparatus is proposed which is configured to perform a nonlinear inverse quantization processing on a bit stream coded by the above-mentioned audio coding apparatus (for example, see Japanese Unexamined Patent Application Publication No. 2000-47850). In the nonlinear inverse quantization processing, as the quantized value which is the input value is an integer value, by previously creating a relation as an inverse quantization table between the quantized value serving as the input value and the inverse quantized value, at the time of the execution of the inverse quantization processing, it is possible to uniquely decide the inverse quantized value on the basis of the inverse quantization table.

SUMMARY OF THE INVENTION

However, in the nonlinear quantization processing, for example, in a case where the input value is a floating point number, like the nonlinear inverse quantization processing, the table in which the quantized value is decided uniquely with respect to the input value is not created.

In addition, in the nonlinear quantization processing by the above-mentioned audio coding apparatus, as the power function is used, the algorithm becomes complex, and many cycle numbers are used.

A CPU (Central Processing Unit) or a DSP (Digital Signal Processor) mounted to the above-mentioned audio coding apparatus has a low operational frequency of several hundred MHz unlike a CPU of a personal computer. Therefore, it is desirable to avoid using a function using the cycle numbers like a math library.

The present invention has been made in view of the above-mentioned circumstances, and it is desirable to perform a nonlinear computation more efficiently.

According to an embodiment of the present invention, there is provided a computation apparatus including: range table creation means configured to create a range table in which a discrete value of a computation result obtained by applying a nonlinear computation on an input value corresponds to a range of the input value which may take the discrete value; and search means configured to search, when the input value is input, in the range table, for the range in which the input value is included and output the discrete value corresponding to the searched range.

The computation apparatus can further include hash table creation means configured to create a hash table on the basis of the range table, in which for at least one of the ranges, on the basis of the hash table, the search means can decide an initial search value of the range in the range table, search for the range in which the input value is included on the basis of the initial search value and the range table, and output the discrete value corresponding to the searched range.

The hash table creation means can create the hash table by using at least one of an exponent part and a significand part of the input value which decides the range in the range table.

When the input value corresponding to the discrete value whose output occurrence rate is high is input, the search means can search for the range in which the input value is included on the basis of the range table, and when the input value corresponding to the discrete value whose output occurrence rate is low is input, the search means can decide an initial search value of the range in the range table on the basis of the hash table and search for the range in which the input value is included on the basis of the initial search value and the range table.

When the input value is input, in the range table, the search means can perform a binary search on the range in which the input value is included.

According to an embodiment of the present invention, there is provided a computation method including the steps of: creating a range table in which a discrete value of a computation result obtained by applying a nonlinear computation on an input value corresponds to a range of the input value which may take the discrete value; and searching, when the input value is input, in the range table, for the range in which the input value is included and outputting the discrete value corresponding to the searched range.

According to an embodiment of the present invention, there is provided a program for instructing a computer to execute a processing including the steps of: creating a range table in which a discrete value of a computation result obtained by applying a nonlinear computation on an input value corresponds to a range of the input value which may take the discrete value; and searching, when the input value is input, in the range table, for the range in which the input value is included and outputting the discrete value corresponding to the searched range.

According to another embodiment of the present invention, there is provided a quantization apparatus including: range table creation means configured to create a range table in which a quantized value of a computation result obtained by applying a nonlinear computation on an input value corresponds to a range of the input value which may take the quantized value; and search means configured to search, when the input value is input, in the range table, for the range in which the input value is included and output the quantized value corresponding to the searched range.

According to another embodiment of the present invention, there is provided a quantization method including the steps of: creating a range table in which a quantized value of a computation result obtained by applying a nonlinear computation on an input value corresponds to a range of the input value which may take the quantized value; and searching, when the input value is input, in the range table, for the range in which the input value is included and output the quantized value corresponding to the searched range.

According to another embodiment of the present invention, there is provided a program for instructing a computer to execute a processing including the steps of creating a range table in which a quantized value of a computation result obtained by applying a nonlinear computation on an input value corresponds to a range of the input value which may take the quantized value; and searching, when the input value is input, in the range table, for the range in which the input value is included and output the quantized value corresponding to the searched range.

According to the embodiment of the present invention, the range table in which the discrete value of the computation result obtained by applying the nonlinear computation on the input value corresponds to the range of the input value which may take the discrete value is created, and when the input value is input, in the range table, for the range in which the input value is included is searched for, and the discrete value corresponding to the searched range is output.

According to the embodiment of the present invention, the range table in which the quantized value of the computation result obtained by applying the nonlinear computation on the input value corresponds to the range of the input value which may take the quantized value is created, and when the input value is input, in the range table, the range in which the input value is included is searched for, and the quantized value corresponding to the searched range is output.

According to the embodiments of the present invention, it is possible to perform the nonlinear computation more efficiently.

BRIEF DESCRIPTION OF THE DRAWINGS

FIG. 2 is a block diagram of a configuration example of a quantization unit in the audio coding apparatus of FIG. 1;

FIG. 3 is a flow chart for describing a range table creation processing by the quantization unit of FIG. 2;

FIG. 4 shows an example of a range table;

FIG. 6 shows an example of a program describing a processing in steps S71 and S72 in the flow chart of FIG. 5 in C language;

FIG. 11 shows an example describing the hash table in C language;

FIG. 13 shows an example of a program describing a processing in steps S171 to S177 in the flow chart of FIG. 12 in C language;

FIG. 14 shows an example of a program describing in C language an example of a case in which a floating point number is a fixed-point number in the example of the program of FIG. 13;

DESCRIPTION OF THE PREFERRED EMBODIMENTS

Hereinafter, embodiments of the present invention will be described with reference to the drawings.

1. First Embodiment

Configuration Example of an Audio Coding Apparatus

Figure 1:
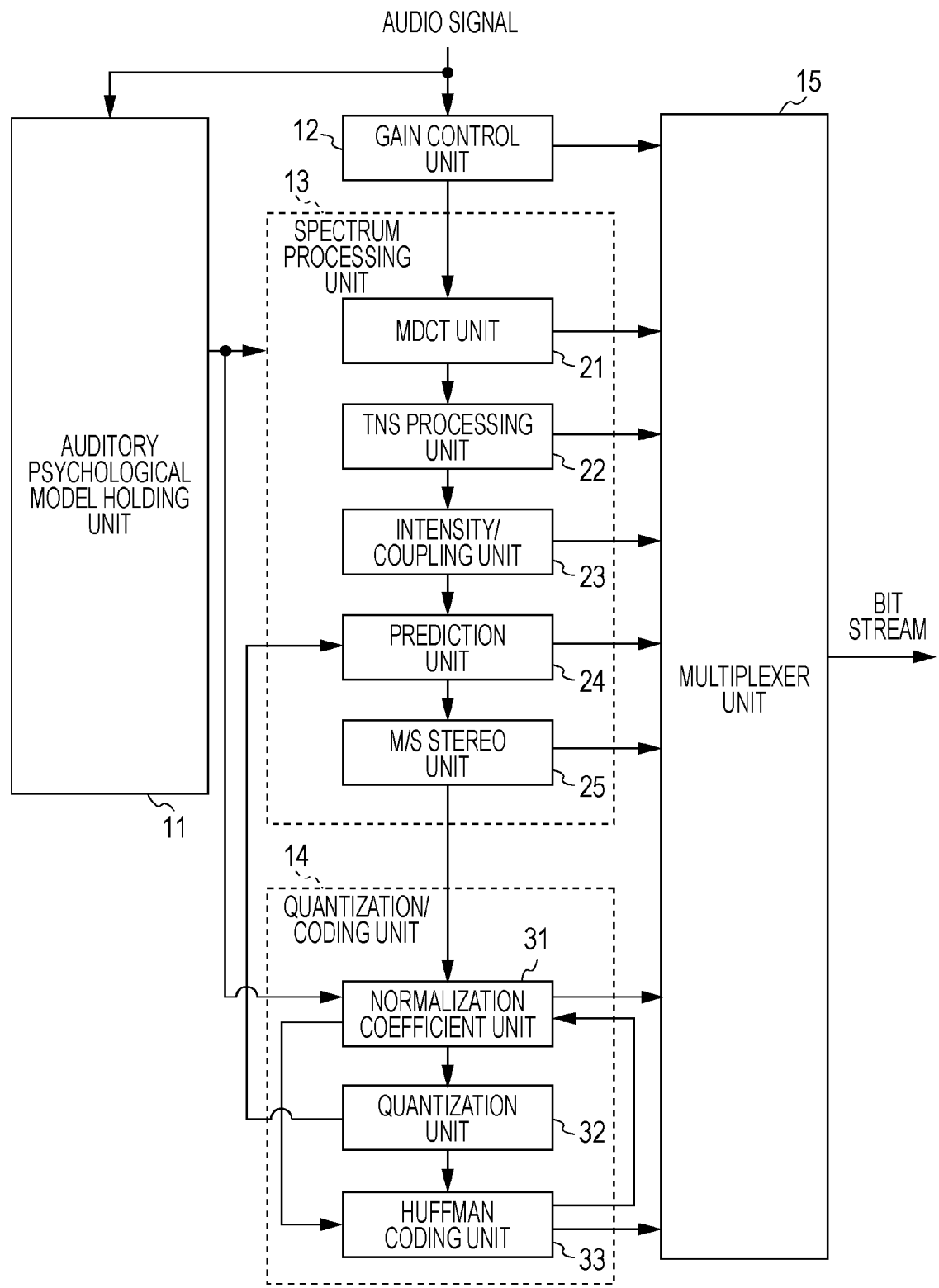
FIG. 1 is a block diagram of a configuration example of an audio coding apparatus according to an embodiment to which the present invention is applied.

FIG. 1 shows a configuration example of an audio coding apparatus according to an embodiment to which the present invention is applied.

The audio coding apparatus of FIG. 1 is composed of an auditory psychological model holding unit 11, a gain control unit 12, a spectrum processing unit 13, a quantization/coding unit 14, and a multiplexer unit 15.

An audio signal input to the audio coding apparatus is supplied to the auditory psychological model holding unit 11 and the gain control unit 12. The auditory psychological model holding unit 11 converts the input audio signal into blocks along the time axis and analyzes the audio signal converted into the blocks in conformity to the human auditory characteristics for each divided band so that a permissible error intensity of the respective divided bands is calculated. The auditory psychological model holding unit 11 supplies the calculated permissible error intensity to the spectrum processing unit 13 and the quantization/coding unit 14.

Among three profiles including Main, LC (Low Complexity), and SSR (Scalable Sampling Rate) prepared as coding algorithms of the AAC standard, the gain control unit 12 is used only for the SSR profile. The gain control unit 12 divides the input audio signal into four frequency bands at regular intervals and performs, for example, a gain adjustment on the bands except for the lowest band to be supplied to the spectrum processing unit 13.

The spectrum processing unit 13 converts the audio signal subjected to the gain adjustment in the gain control unit 12 into spectrum data of the frequency domain. Also, the spectrum processing unit 13 controls the respective units of the spectrum processing unit 13 on the basis of the permissible error intensity supplied from the auditory psychological model holding unit 11 and applies a predetermined processing on the spectrum data.

The spectrum processing unit 13 is provided with an MDCT (Modified Discrete Cosine Transform) unit 21, a TNS (Temporal Noise Shaping) processing unit 22, an intensity/coupling unit 23, a prediction unit 24, and an M/S stereo (Middle/Side Stereo) unit 25.

The MDCT unit 21 converts the audio signal in the time domain supplied from the gain control unit 12 into spectrum data in the frequency domain (MDCT coefficient) to be supplied to the TNS processing unit 22. The TNS processing unit 22 regards the spectrum data from the MDCT unit 21 as the signal in time domain to perform a linear prediction and performs a prediction filtering on the spectrum data to be supplied as a bit stream to the intensity/coupling unit 23. The intensity/coupling unit 23 applies a compression processing utilizing a correlation of different channels (stereo correlation coding processing) on the audio signal serving as the spectrum data from the TNS processing unit 22.

The prediction unit 24 is used only for the Main profile among the above-mentioned three profiles. The prediction unit 24 uses the audio signal subjected to the stereo correlation coding in the intensity/coupling unit 23 and the audio signal supplied from the quantization/coding unit 14 to perform a prediction coding and supplies the audio signal thus obtained to the M/S stereo unit 25. The M/S stereo unit 25 performs the stereo correlation coding on the audio signal from the prediction unit 24 to be supplied to the quantization/coding unit 14.

The quantization/coding unit 14 is provided with a normalization coefficient unit 31, a quantization unit 32, and a Huffman coding unit 33. The quantization/coding unit 14 converts the audio signal from the M/S stereo unit 25 of the spectrum processing unit 13 into a code string to be supplied to the multiplexer unit 15.

The normalization coefficient unit 31 supplies the audio signal from the M/S stereo unit 25 to the quantization unit 32 and calculates a normalization coefficient used for the quantization for the audio signal on the basis of the audio signal to be supplied to the quantization unit 32 and the Huffman coding unit 33. In the quantization apparatus of FIG. 1, for example, the permissible error intensity from the auditory psychological model holding unit 11 is used to calculate a quantization step width parameter as the normalization coefficient for each divided band.

The quantization unit 32 uses the normalization coefficient from the normalization coefficient unit 31 to perform nonlinear quantization on the audio signal supplied from the normalization coefficient unit 31 and supplies the audio signal thus obtained (quantized value) to the Huffman coding unit 33 and the prediction unit 24. On the basis of a previously determined Huffman coding table, the Huffman coding unit 33 performs the Huffman coding on the normalization coefficient from the normalization coefficient unit 31 and the quantized value from the quantization unit 32 to be supplied to the multiplexer unit 15.

The multiplexer unit 15 multiplexes various types of information generated in the process of the coding on the audio signal which are respectively supplied from the gain control unit 12 as well as the components from the MDCT unit 21 up to the normalization coefficient unit 31, with the Huffman code from the Huffman coding unit 33. As a result, the multiplexer unit 15 generates a bit stream of the audio signal and outputs the generated bit stream of the audio signal.

A nonlinear quantization processing on the audio signal by the quantization unit 32 described above is performed by calculating Expression (1) while the value of the audio signal from the normalization coefficient unit 31 is set as an input value X and the quantization step width parameter representing the quantization step width from the normalization coefficient unit 31 is set as q. That is, as Expression (1) is calculated, a quantized value Z is found from the input value X functioning as the audio signal.

[Expression 1]

$$Z = (\text{int})\left(\left(\frac{X}{2^{q/4}}\right)^{3/4} - 0.0946 + 0.5\right) \quad (1)$$

It should be noted that in Expression (1), (int)(A) represents a computation for obtaining an integer part by cutting off a fractional part of a floating point number A.

In the coding of the AAC standard, when the quantized value Z is regulated as 14 bits and a value Y before the quantization=$X/2^{q/4}$ is established, the value Y before the quantization takes a value in a range of $0 \leq Y < 8191.5943^{(4/3)}$ through an inverse operation. Therefore, the quantized value Z takes an integer in a range of $0 \leq Z \leq 8191$, and in order that the quantized value Z takes a value in this range, the quantization step width parameter q is decided.

Also, in the quantization processing on the audio signal, the quantization unit 32 performs the inverse quantization on the quantized values Z with respect to all the input values X to check whether or not the quantization errors stay in a predetermined range. For example, the inverse quantization is performed through the computation of Expression (2), and an inverse quantized value W is obtained.

[Expression 2]

$$W = (Z)^{4/3} \quad (2)$$

Furthermore, the quantization error is obtained by calculating a difference between the inverse quantized value W and the input value X, and it is determined whether or not this difference takes a value within the predetermined range.

That is, in the nonlinear inverse quantization processing, the quantized value Z which is the input value is an integer value. Thus, by creating the relation between the quantized value Z and the inverse quantized value W as a table in advance, at the time of the execution of the inverse quantization processing, the inverse quantized value can be uniquely decided on the basis of the table. On the other hand, in the nonlinear quantization processing, in a case where the input value X in Expression (1) is a floating point number, the value Y before the quantization=$X/2^{q/4}$ is also a floating point number. Thus, the table in which the quantized value Z is uniquely decided with respect to the value Y before the quantization is not created.

Configuration Example of the Quantization Unit

In view of the above, with reference to a block diagram of FIG. 2, a configuration example of the quantization unit 32 in which a nonlinear computation is performed efficiently in the quantization processing will be described.

The quantization unit 32 of FIG. 2 is composed of a range table creation unit 71 and a search quantization unit 72 and outputs the quantized value Z on the basis of the input data X serving as the audio signal from the normalization coefficient unit 31.

In Expression (3) which will be described below, the range table creation unit 71 sequentially changes (increases) the value Y before the quantization to create a range table in which the value Y before the quantization when the quantized value Z is changed corresponds to the quantized value Z at that time and supplies the range table to the search quantization unit 72. To be more specific, the range table creation unit 71 sequentially increases the value Y before the quantization from 0.00000000 to 0.00000001, 0.00000002, 0.00000003, . . . , and obtains the value Y before the quantization when the quantized value Z serving as the discrete value is changed. Then, the range table creation unit 71 creates the range table in which the value Y before the quantization when the quantized value Z is changed corresponds to the quantized value Z at that time.

[Expression 3]

$$Z = (\text{int})(Y^{3/4} - 0.0946 + 0.5) \quad (3)$$

When the value before the quantization corresponding to the quantized value Z[m] is set as Y[m], a range of the value Y before the quantization which may take the quantized value Z[m] is Y[m−1]≤Y<Y[m] (m is an identifier of the input data X and is an integer larger than 0). That is, for example, the range table creation unit 71 creates the range table in which the quantized value Z[m] corresponds to the range of the value Y before the quantization Y[m−1]≤Y<Y[m]. It should be noted that hereinafter, the range table in which the quantized value Z[m] corresponds to the range of the value Y before the quantization Y[m−1]≤Y<Y[m] is simply referred to as range table in which the quantized value Z[m] corresponds to (the border values of) the range of the value Y before the quantization.

The search quantization unit 72 is provided with a search unit 72a and a decision unit 72b. In the range table supplied from the range table creation unit 71, the search unit 72a searches for the range in which the value Y before the quantization is included from the input data X supplied from the normalization coefficient unit 31. The decision unit 72b decides the quantized value Z corresponding to the range searched for by the search unit 72a and supplies the quantized value Z to the Huffman coding unit 33.

With the above-mentioned configuration, on the basis of the previously created range table, the quantization unit 32 searches for the range corresponding to the value before the quantization obtained from the input data and outputs the quantized value.

Range Table Creation Processing by the Quantization Unit

Next, with reference to a flow chart of FIG. 3, a range table creation processing by the quantization unit 32 of FIG. 5 will be described. In the quantization unit 32, the range table creation processing is carried out before the quantization processing is performed.

In step S51, the range table creation unit 71 sequentially increases the value Y before the quantization in Expression (3) described above to create the range table in which the value Y before the quantization when the quantized value Z is changed corresponds to the quantized value Z at that time and supplies the range table to the search quantization unit 72.

For example, as shown in FIG. 4, the range table creation unit 71 creates the range table in which the quantized value Z corresponds to (the border values of) the range of the value Y before the quantization. The quantized value Z is an integer in the range of $0 \leq Z \leq 8191$ and corresponds to (the border values of) the range of the value Y before the quantization obtained on the basis of Expression (3) in FIG. 4 with regard to the respective quantized values Z.

Through the above-mentioned processing, before the quantization processing is performed, it is possible to create the range table in which the range of the value Y before the quantization corresponds to the quantized value Z.

Quantization Processing by the Quantization Unit

Next, with reference to a flow chart of FIG. 5, the quantization processing by the quantization unit 32 of FIG. 5 will be described.

In step S71, in the range table previously supplied from the range table creation unit 71, the search unit 72a of the search quantization unit 72 searches for the range in which the value Y before the quantization calculated from the input data X supplied from the normalization coefficient unit 31 is included. To be more specific, the search quantization unit 72 calculates the value Y before the quantization=$X/2^{q/4}$ from the input data X from the normalization coefficient unit 31 and searches for the range in which the calculated value Y before the quantization is included in the range table.

In step S72, the decision unit 72b of the search quantization unit 72 decides the quantized value Z corresponding to the range decided by the search unit 72a and supplies the quantized value Z to the Huffman coding unit 33.

Figure 5:
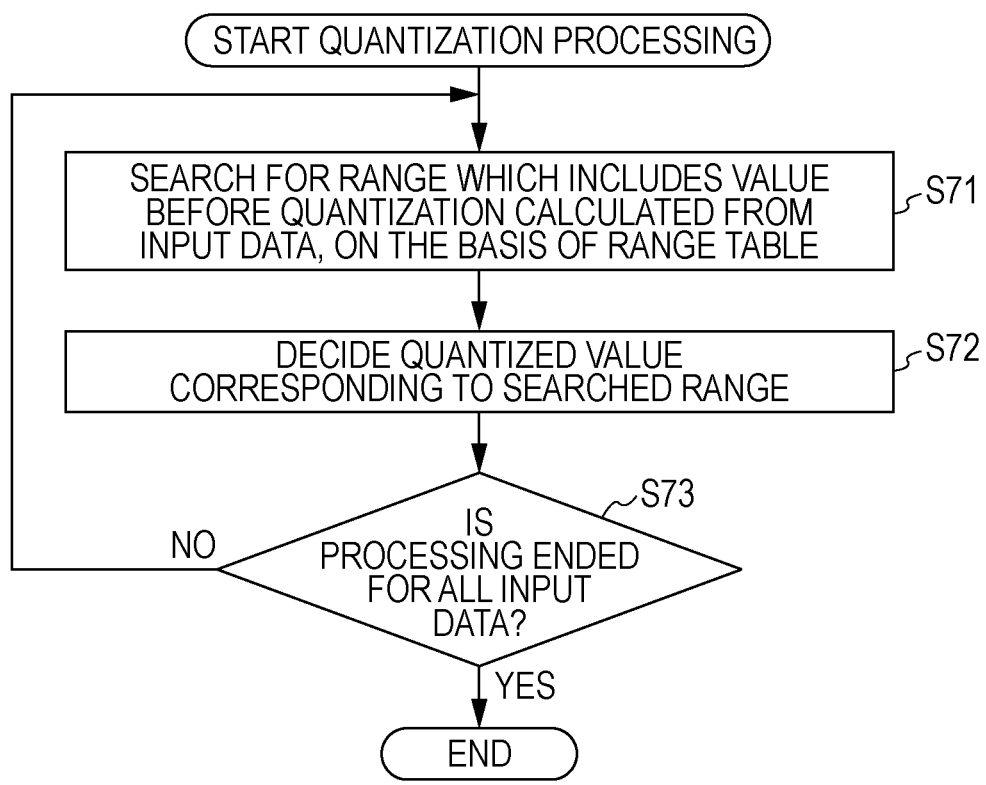
FIG. 5 is a flow chart for describing the quantization processing by the quantization unit of FIG. 2.

FIG. 6 shows a program example describing the processing in steps S71 and S72 in the flow chart of FIG. 5 in C language.

In a program 81 of FIG. 6, numerals at the left end of the respective lines denote the line number for the respective lines, which are provided for the description. That is, the numerals are not substantial for the actual description. Hereinafter, the same applies in other program examples.

Line 1 in the program 81 defines that m representing the identifier of the input data is incremented one each from 0 to data_size, and the following processing is repeatedly performed.

On lines 2 and 3 in the program 81, it is determined whether or not the value Y[m] before the quantization which is input at the m-th is smaller than 4.9999600e-01F. In a case where the value Y[m] before the quantization is smaller than 4.9999600e-01F, in the range table, the quantized value Z[m]=0 corresponding to the range of the value Y[m] before the quantization<4.9999600e-01F is decided.

On the other hand, in a case where the value Y[m] before the quantization is not smaller than 4.9999600e-01F, on lines 5 and 6, it is determined whether or not the value Y[m] before the quantization which is input at the m-th is smaller than 1.8629548e+00F. In a case where the value Y[m] before the quantization is smaller than 1.8629548e+00F, in the range table, the quantized value Z[m]=1 corresponding to the range of the value Y[m] before the quantization<1.8629548e+00F is decided.

After that, similarly, up to line N-2, the range in which the value Y[m] before the quantization is included is sequentially searched for from a smaller value in the range table (processing in step S71), and the quantized value Z[m] set in the range corresponding to the value Y[m] before the quantization is decided (processing in step S72).

In this manner, without performing the nonlinear computation, the quantized value can be decided through the search by 8192 times at a maximum.

While referring back to the flow chart of FIG. 5, in step S73, the search quantization unit 72 determines whether or not the processing of searching for the quantized value Z is ended with respect to all the input data of the data_size pieces. In a case where the processing of searching for the quantized value Z is not ended with respect to all the input data, the processing is returned to step S71, until the processing is ended with respect to all the input data of the data_size pieces, the processing in step S71 to S73 is repeatedly performed.

Through the above-mentioned processing, on the basis of the range table in which the quantized value Z previously obtained correspond to the range of the value Y before the quantization which may take the quantized value Z, it is possible to decide the quantized value Z corresponding to the value Y before the quantization calculated from the input data X. Therefore, without computing the power function of ¾ which is the nonlinear function included in Expression (3), it is possible to decide the quantized value Z through the search based on the condition as described in FIG. 6, and it is possible to perform the nonlinear computation more efficiently.

In the above, the example of deciding the quantized value through the search among the 8192 conditions in turn has been described, but for example, if a binary search is used, the quantized value can be decided through the determination performed by 13 times as $2^{13}=8192$ is established.

Figure 7:
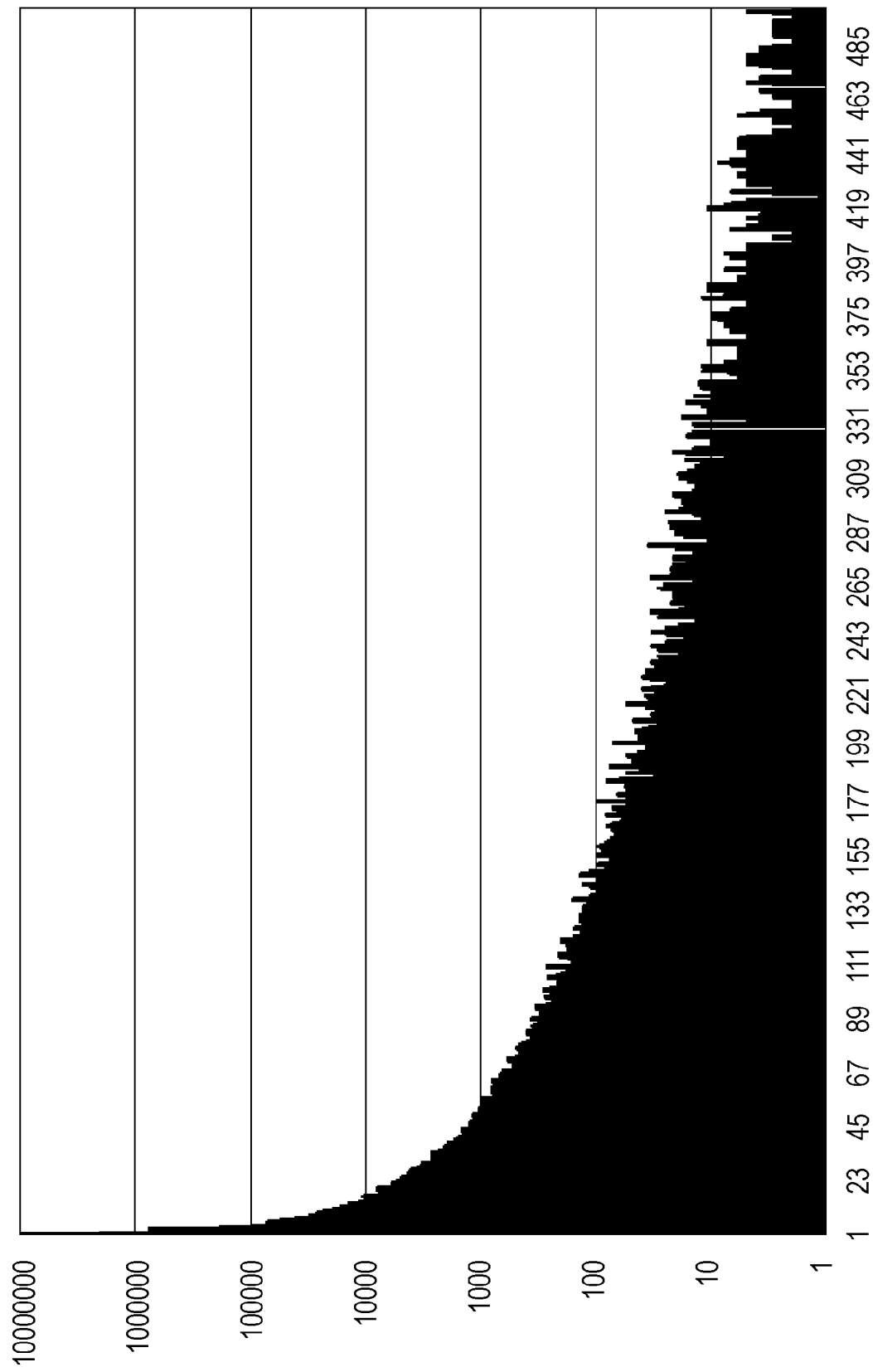
FIG. 7 is an explanatory diagram for describing an occurrence rate of the quantization processing on the quantized value.

Incidentally, as shown in the histogram with respect to the quantized value Z of FIG. 7, as to the quantized value Z, the occurrence rate of the quantization processing in which the quantized value of about Z<10 is obtained is high, and the occurrence rate of the quantization processing in which the quantized value Z=0 is obtained is highest. Also, as the quantized value Z becomes larger, the occurrence rate of the quantization processing in which the quantized value Z is obtained becomes lower. That is, FIG. 7 shows that as the quantized value Z is smaller, the number of times for the quantization processing in which the quantized value Z is obtained is larger. It should be noted that in FIG. 7, the horizontal axis represents the quantized value Z, and the vertical axis represents the occurrence rate (number of times) of the quantization processing.

Hereinafter, the example of the quantization unit utilizing the tendency on the occurrence rate of the quantization processing will be described.

2. Second Embodiment

Configuration Example of the Quantization Unit

Figure 8:
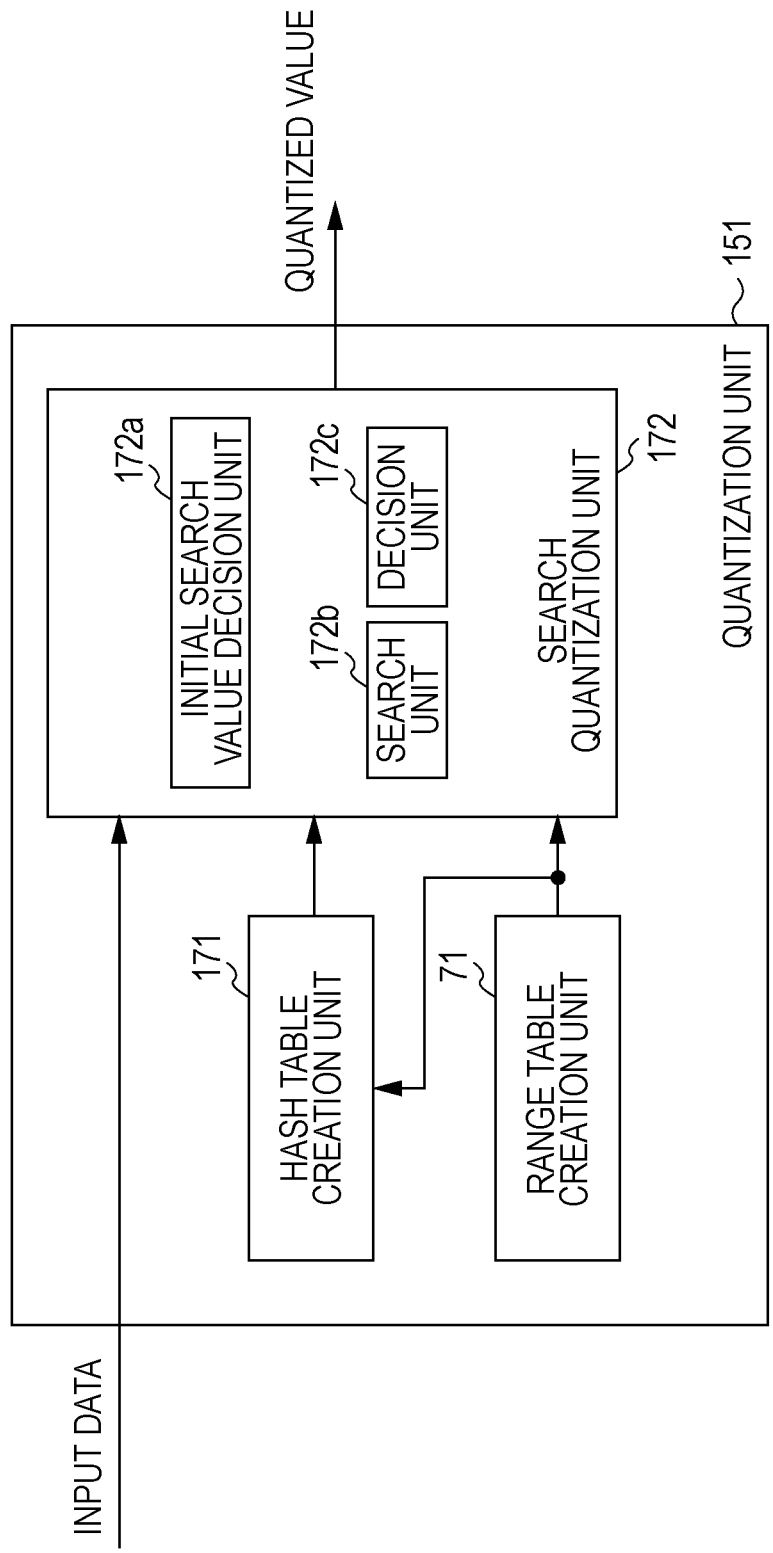
FIG. 8 is a block diagram of another configuration example of the quantization unit.

FIG. 8 shows a configuration example of the quantization unit which utilizes a tendency of the occurrence rate of the quantization processing. It should be noted that in a quantization unit 151 of FIG. 8, a configuration having a similar function to that provided to the quantization unit 32 of FIG. 2 is assigned with the same name and the same symbol, and a description thereof is appropriately omitted.

That is, in a quantization unit 151 of FIG. 8, a difference from the quantization unit 32 of FIG. 2 resides in that a hash table creation unit 171 is newly provided, and instead of using the search quantization unit 72, a search quantization unit 172 is provided.

In a quantization unit 151 of FIG. 8, the range table creation unit 71 supplies the created range table to the hash table creation unit 171 and the search quantization unit 172.

The hash table creation unit 171 creates a hash table for speeding up the table value search on the basis of the range table from the range table creation unit 71 and supplies the hash table to the search quantization unit 172.

Herein, the hash table refers to a table in which the ranges in which the quantized values which are the table values in the range table are divided into groups in accordance with the values before the quantization, and information representing the relevant group is set as a table value. That is, according to the hash table, when the value before the quantization is input, the group corresponding to the value before the quantization is decided, and in the group, a search for an initial search value which is a table value that should be searched for first is started. Therefore, it is possible to search for the table value faster than the sequential search with respect to all the table values defined by the range table. It should be noted that a detail of the hash table creation will be described below.

The search quantization unit 172 is provided with an initial search value decision unit 172a, a search unit 172b, and a decision unit 172c. The initial search value decision unit 172a uses the hash table supplied from the hash table creation unit 171 to decide the value of the search start (the initial search value) in the range table. The search unit 172b searches the range in which the value Y before the quantization is included which is calculated from the input data X supplied from the normalization coefficient unit 31 from the initial search value decided by the initial search value decision unit 172a in the range table supplied from the range table creation unit 71. The decision unit 172c decides the quantized value Z corresponding to the range searched for by the search unit 172b and supplies the quantized value Z to the Huffman coding unit 33.

With the above-mentioned configuration, on the basis of the previously created range table and the hash table, the quantization unit 151 searches for the quantized value corresponding to the value before the quantization obtained from the input data and decides the quantized value.

Hash Table Creation Processing by the Quantization Unit

Figure 9:
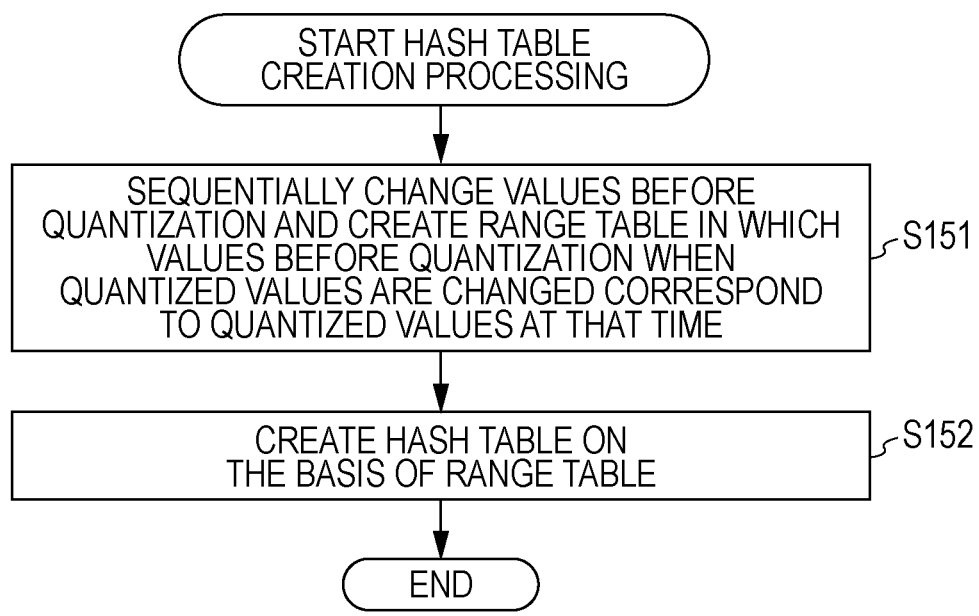
FIG. 9 is a flow chart for describing a hash table creation processing by the quantization unit of FIG. 8.

Next, with reference to a flow chart of FIG. 9, a hash table creation processing by the quantization unit 151 of FIG. 8 will be described. In the quantization unit 151, the hash table creation processing is performed before performing the quantization processing. It should be noted that the processing in step S151 in the flow chart of FIG. 9 is similar to the range table creation processing described with reference to the flow chart of FIG. 3, and a description thereof will be omitted.

That is, in step S152, the hash table creation unit 171 creates the hash table on the basis of the range table from the range table creation unit 71 and supplies the hash table to the search quantization unit 172.

To be more specific, for example, the hash table creation unit 171 uses an exponent part and a significand part of the floating point number based on IEEE (Institute for Electrical and Electronics Engineering) 754 to create the hash table.

Figure 10:
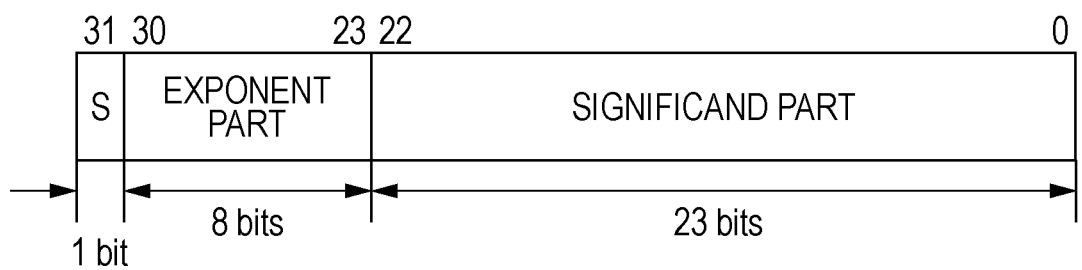
FIG. 10 is an explanatory diagram for describing floating point type data.

The floating point type data representing the single-precision floating point number based on the IEEE754 standard is constructed of a bit string of 32 bits as shown in FIG. 10. That is, a part from the 0-th bit to the 22nd bit which are the least significant bits of data on the floating point number is set as a significand F of the significand part, a part from the 23rd bit and the 30th bit is set as an exponent E of the exponent part, and a part at the 31st bit which is the most significant bit is set as a code bit S.

At this time, in a case where the significand part is positive, the code bit S is "0", and in a case where the significand part is negative, the code bit S is "1". Also, the bit configuration of the exponent part is the "exponent+bias". For example, according to the standard of IEEE754, 127 is used as the single-precision bias. Thus, when the numeric value of the exponent is "0", the value of the exponent part is "127" (=0+127), and the exponent part has a bit configuration of 127 (0x7f) ("0x" represents that "7f" is hexadecimal).

It should be noted that the case in which the exponent part is 0 and 255 has a meaning of a special value, but a description thereof will be omitted.

When the value represented by the above-mentioned floating point type data is represented by a numerical representation format, the value is as shown in Expression (4).

[Expression 4]

$$(-1)^S \times 2^{(E-B)} \times (1+F) \quad (4)$$

It should be noted that in Expression (4), ".F" represents that the significand part is subjected to the decimal representation as the decimal point exists before the significant bit of the significand F. Also, "B" in Expression (4) represents a bias component, and "S" represents a code bit.

Next, an example of the hash table creation procedure using the exponent part and the significand part of the floating point number described above will be described.

The hash table creation unit 171 subtracts 125 from the value of the exponent part of the 8 bits as to the exponent part and set the value as index1. In this case, the range where the quantized value Z=0 is established is $0 \leq Y < 0.4999600$, $0.25 \leq 0.4999600 < 0.5$ is satisfied, and in the interval of 0.25 to 0.5, the value of the exponent part is 125. Thus, the subtraction value of the exponent part is set as 125. Also, the range where the quantized value Z=8191 is established is $1.6512946 \times 10^5 \leq Y$, the exponent part when $1.6512946 \times 10^5$ is represented by the single-precision floating point number is 144. This index1 takes a value of 0 to 19.

Also, the hash table creation unit 171 sets four significant bits of the significand part of the 23 bits as index2 as to the significand part. This index2 takes a value of 0 to 15.

With respect to the hash table functioning as a two-dimensional array in which index1 and index2 are set as element counts, the hash table creation unit 171 takes out the exponent part and the significand part from 8192 pieces of values in the range table to be arranged in the hash table (two-dimensional array) while index of the range table in which one value of index1 and index2 is changed is set as an element. In the present case, as the quantized value starts from 0, the index of the range table is the same as the quantized value Z.

The procedure of the hash table creation will be described while using the range table quantize_tab[8192] of FIG. 13 which will be described below. This quantize_tab[1]= 1.8629548 of the index 1 takes index1=3 and index2=12, and quantize_tab[2]=3.5652816 of index2 takes index1=4 and index2=6. As a result, the range where the quantized value Z=2 is established is $1.8629548 \leq Y < 3.5652816$, and therefore the combination of index1 and index2 for the value Y before the quantization in this interval is index1=3 and index2=12 to 15, or index1=4 and index2=0 to 6. In the hash table of these index1 and index2, index2 of the range table is arranged.

FIG. 11 shows an example of the hash table quantize_hash [index1] [index2] created in the above-mentioned procedure described in C language on the basis of the range table quantize_tab[8192] of FIG. 13 which will be described below.

In a program 181 of FIG. 11, quantize_hash[20] [16] represents a two-dimensional array of 20×16.

For example, on lines 3 and 4, table values of index1=0 and index2=0 to 16 are described. On lines 6 and 7, table values of index1=1 and index2=0 to 16 are described. After that, table values are described in a similar manner, and on lines N-3 and N-2, table values of index1=19 and index2=0 to 16 are described.

As shown in the program 181 of FIG. 11, when the exponent part and the significand part are used for the hash table, as table values (elements) in the hash table, many of values with the small quantized values are allocated.

In particular, in a case where index1=8 or lower is established on lines 3 to 28, the difference with the adjacent value is only 1. Thus, in the quantization processing which will be described below, the quantized value Z can be decided through the search performed only once for the value Y before the quantization with index1=8 or lower.

Also, in a case where the above-mentioned hash table is used, for example, when index1=18 and index2=0 are established, the difference of the table value 4096 at this time and the next table value 4286 (range of the values before the quantization) is 190, and the search is to be performed by 190 times. However, as shown in FIG. 7, as the quantized value in the vicinity of this table value is hardly generated, there is no problem even when the number of the searches becomes large.

As the result of the above-mentioned processing, before the quantization processing is performed, it is possible to create the hash table in which the search for the table value in the range table is promptly performed.

Quantization Processing by the Quantization Unit

Next, with reference to a flow chart of FIG. 12, the quantization processing by the quantization unit 151 of FIG. 8 will be described.

In step S171, the search unit 172b of the search quantization unit 172 searches for a range in which the value Y before the quantization corresponding to the input data X supplied from the normalization coefficient unit 31 is included by the predetermined times by using the conditional sentence on the basis of the range table previously supplied from the range table creation unit 71.

To be more specific, the search unit 172b calculates the value Y before the quantization=$X/2^{q/4}$ from the input data X from the normalization coefficient unit 31 and searches for a range which includes the calculated value Y before the quantization in the range table by the predetermined times by using the conditional sentence.

In step S172, the search unit 172b determines whether or not the range which includes the value Y before the quantization is obtained through the search by the predetermined times.

In step S172, in a case where it is determined that the range which includes the value Y before the quantization in the range table is obtained through the search by the predetermined times, the processing advances to step S173.

In step S173, the decision unit 172c of the search quantization unit 172 decides the quantized value corresponding to the range searched for by the search unit 172b and supplies the quantized value Z to the Huffman coding unit 33, and the processing advances to step S177.

On the other hand, in step S172, in a case where it is determined that the range which includes the value Y before the quantization in the range table is not obtained through the search by the predetermined times, the processing advances to step S174.

In step S174, the initial search value decision unit 172a of the search quantization unit 172 uses the hash table supplied from the hash table creation unit 171 to decide the initial search value in the range table. To be more specific, the initial search value decision unit 172a calculates the value Y before the quantization=$X/2^{q/4}$ from the input data X from the normalization coefficient unit 31, and calculates index1 and index2 on the basis of the exponent part and the significand part of the value Y before the quantization thus calculated (floating point number) to decide the initial search value in the range table from the hash table.

In step S175, on the basis of the initial search value and the range table supplied from the range table creation unit 71, the search unit 172b searches for the range which includes the value Y before the quantization corresponding to the input data X.

In step S176, the decision unit 172c decides the quantized value Z corresponding to the range searched for by the search unit 172b and supplies the quantized value Z to the Huffman coding unit 33.

In step S177, the search quantization unit 172 determines whether or not the processing of searching for the quantized value Z is ended with respect to all the data_size pieces of the input data. In a case where it is determined that the processing of searching for the quantized value Z is not ended with respect to all the input data, the processing is returned to step S171, and until the processing is ended with respect to all the input data of the data_size pieces, the processing in steps S171 to S177 is repeatedly performed.

Figure 12:
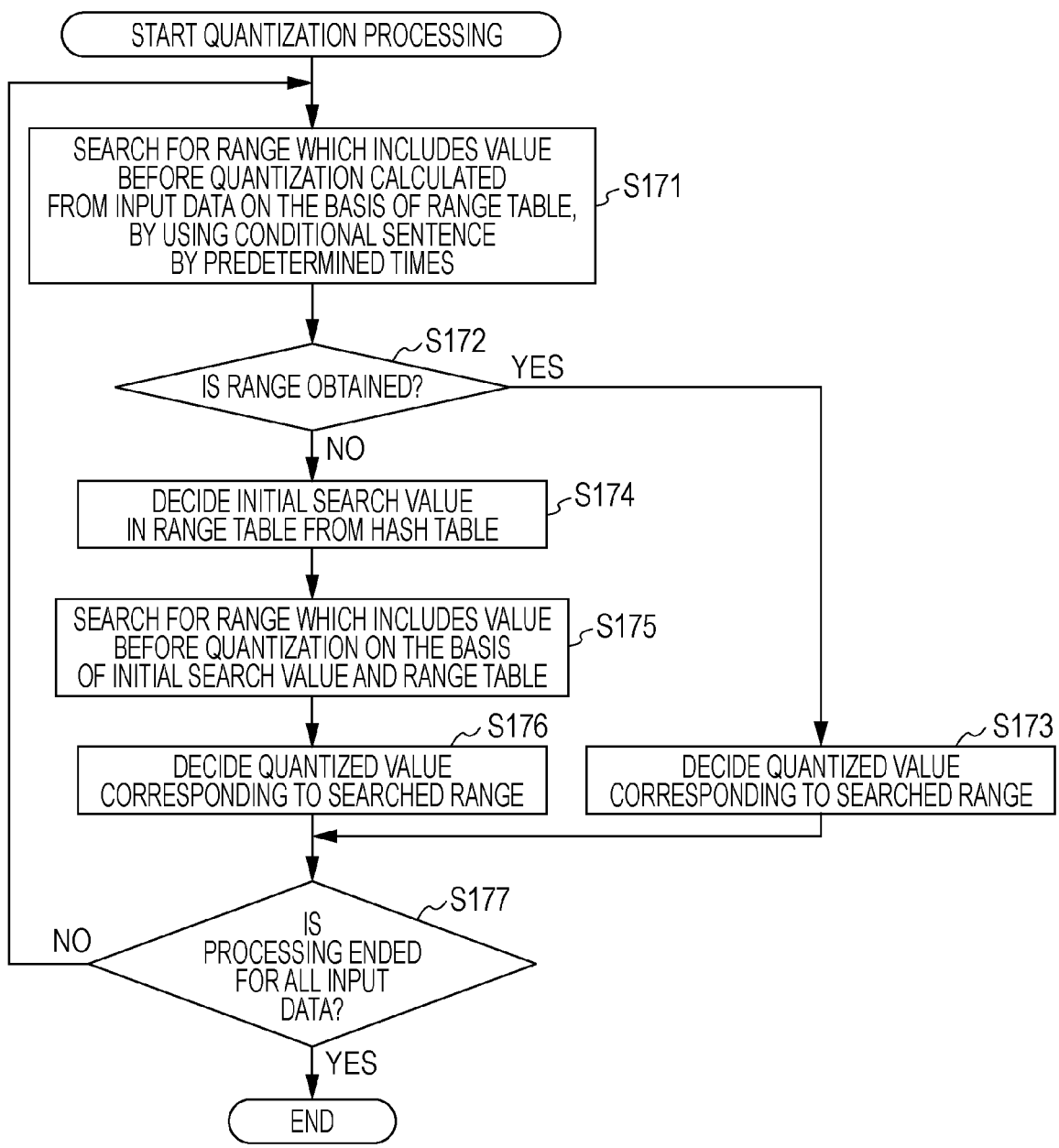
FIG. 12 is a flow chart for describing the quantization processing by the quantization unit of FIG. 8.

FIG. 13 shows an example of the program describing the processing in steps S171 to S177 in the flow chart of FIG. 12 in C language.

In the program 191 of FIG. 13, quantize_tab[8192] on lines 1 to 8195 represents the range table.

Lines 8196 to 8199 define that the value uni0 is used as data of a different type. Also, line 8200 defines that m representing the identifier of the input data is incremented one each from 0 to data_size, and the following processing is repeatedly performed.

On lines 8202 to 8215, the range in which the value Y[m] before the quantization (=uni0.f) is included is searched for in turn by five times on the basis of the conditional sentence (processing in step S171).

Also, on lines 8218 to 8220, by using the hash table quantize_hash[index1] [index2] described in FIG. 11, the initial search value of the value Y[m] before the quantization (=uni0.f) is decided (processing in step S174).

Then, on lines 8221 and 8222, on the basis of the initial search value k and the range table quantize_tab[k], the range in which the value Y[m] before the quantization (=uni0.f) is included is searched for (processing in step S175).

In this manner, in a case where the value before the quantization is large, the initial search value is decided on the basis of the hash table. Thus, the range in which the value before the quantization is included is searched for more promptly than the program 81 of FIG. 6 where the values are searched for sequentially from the smaller values.

As the result of the above-mentioned processing, it is possible to decide the quantized value Z corresponding to the value Y before the quantization which is calculated from the input data X on the basis of the range table with respect to the quantized value whose occurrence rate of the quantization processing is high and on the basis of the has table with respect to the quantized value whose occurrence rate of the quantization processing is low. Therefore, as it is possible to decide the quantized value Z without computing the power function of ¾ which is the nonlinear function shown in Expression (3) and also through the search performed by the still smaller times, it is possible to perform the nonlinear computation more efficiently and also more promptly.

It should be noted that in the above description, the quantized value Z is obtained by using the conditional sentence determination based on the range table and the decision of the initial search value based on the hash table in combination, but the quantized value Z may be obtained by only using the decision of the initial search value based on the hash table.

Application Example in the Fixed-Point Number

In the above description, the value before the quantization and the values in the range table are treated as the floating point numbers, but those values can also be treated as the fixed-point numbers. To be more specific, the range of the value before the quantization corresponding to the quantized value is calculated by way of the floating point number, and on the basis of the floating point number, an integer part of the fixed-point number may be calculated.

Hereinafter, an example using the range table and the hash table in combination will be described in the above-mentioned case in which with respect to the range table quantize_tab[8192] represented by the floating point number, the position of the decimal point is provided at the 8th bit among the 32 bits to be set as the fixed-point number. As the position of the decimal point is at the 8th bit, the range table value is created by multiplying by 256 and taking only the integer part.

First, the calculation for index1 and index1 in the hash table by the initial search value decision unit 172*a* is performed by the following procedure.

That is, in the value Y before the quantization, a position cnt of the most significant bit where 1 is turned on is searched for, and index1 is calculated by Expression (5).

[Expression 5]

$$index1 = cnt - P + 2 \quad (5)$$

In Expression (5), P represents the position of the decimal point, and in this case, P=8 is established. Also, "2" in Expression (5) is a difference between 125 which functions as the reference for the exponent part at the time of the creation for the hash table of the floating point number and the bias 127 defined by the standard of IEEE754.

Also, as shown in Expression (6) and Expression (7), in the value Y before the quantization, index2 is calculated while the most significant bit where 1 is turned on is turned into 0, and the shift is carried out on the right by cnt−4.

[Expressions 6 and 7]

$$Y = Y - \text{mask} \quad (6)$$

$$index2 = Y >> (cnt - 4) \quad (7)$$

It should be noted that "mask" in Expression (6) is hexadecimal, starts from "0x40000000" ("100 0000 0000 0000 0000 0000 0000 0000" in the binary digit (32 bits)), and is subjected to a right shift computation by one bit each up to the most significant bit where 1 is turned on with respect to the value Y before the quantization. Eventually, "mask" becomes a value representing the most significant bit where 1 is turned on with respect to the value Y before the quantization. That is, through the subtraction in Expression (6), the most significant bit where 1 is turned on is set as 0. ">>" in Expression (7) represents the right shift computation.

FIG. 14 shows an example of a program describing a case in which the value of the floating point number in the range table quantize_tab [8192] explained with reference to FIG. 13 is set as the fixed-point number where the position of the decimal point is at the 8th bit among the 32 bits in C language.

In a program 201 of FIG. 14, quantize_tab_int[8192] on lines 1 to 8195 represents the range table converted into fixed-point numbers.

Line 8196 defines an integer type value yin. Also, line 8197 in the program 81 defines that m representing the identifier of the input data is incremented one each from 0 to data_size, and the following processing is repeatedly performed.

On lines 8199 to 8212, the range which includes the value Y[m] before the quantization (=yin) converted into the fixed-point number where the position of the decimal point is at the 8th bit among the 32 bits is searched for by five times (processing in step S171).

Also, on lines 8223 to 8225, by using the hash table quantize_hash[index1][index2] described with reference to FIG. 11, the initial search value for the value Y[m] before the quantization (=yin) is decided (processing in step S174).

Then, on lines 8226 and 8227, on the basis of the initial search value k and the range table quantize_tab[k], the range which includes the value Y[m] before the quantization (=yin) is searched for (processing in step S175).

In the above-mentioned processing too, without computing the power function included in Expression (1), the quantized value can be decided through the search by using the range table composed of the fixed-point value and the hash table, and it is therefore possible to perform the nonlinear computation more efficiently.

Execution Result

Figures 15, 16:
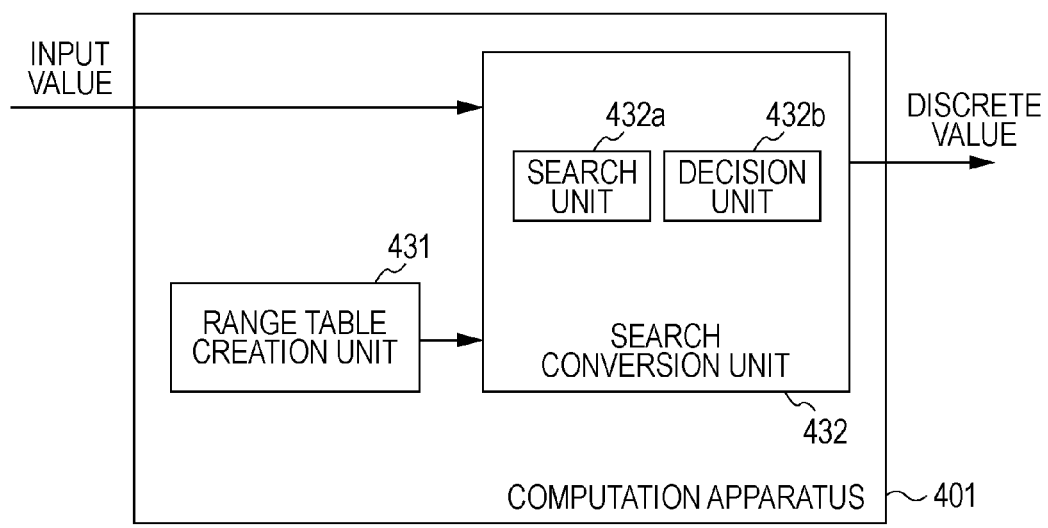
FIG. 15 is an explanatory diagram for describing the number of cycles when the quantization processing is applied.
FIG. 16 is a block diagram of a configuration example of a computation apparatus according to an embodiment to which the present invention is applied.

Now, with reference to FIG. 15, the cycle number when the above-mentioned quantization processing is applied will be described. FIG. 15 shows the cycle numbers when the above-mentioned quantization processing is executed by using R4000 of MIPS Technologies, Inc. functioning as a RISC (Reduced Instruction Set Computer) CPU.

As shown in FIG. 15, while the cycle number when the quantization processing including the computation based on the related art method (the power function included in Expression (1)) is executed is set as 1.00, the cycle number when the quantization processing (FIG. 5) using the conditional sentence (range table) (including the search based on the condition) is 0.28, which leads to the efficiency improvement by 72%. Also, the cycle number when the quantization processing using the hash table is executed is 0.32, which leads to the efficiency improvement by 68%. In addition, the cycle number when the quantization processing (FIG. 12) using the conditional sentence and the hash table in combination is executed is 0.21, which leads to the efficiency improvement by 79%.

As described above, with the quantization processing according to the embodiment of the present invention, it is possible to improve the efficiency as compared to the related art method.

3. Third Embodiment

Nonlinear Function and Discrete Value

In the above, the quantization processing using the inverse quantization table for performing the inverse quantization processing has been described, but on the basis of the relation described in FIG. 4, the inverse quantization processing can also be performed by using the quantization table for performing the quantization processing.

Also, in the above, the power function used in the quantization processing in conformity to the AAC standard as the nonlinear function has been described as an example. However, as shown in Expression (8), as to the predetermined nonlinear function func(X) with respect to the input value X, also in a case where the discrete value Y is obtained, the embodiment of the present invention can be applied.

[Expression 8]

$$Y=(\text{int})(\text{func}(X)) \qquad (8)$$

In addition, in the above, the description has been given while assuming that the discrete value is an integer. However, as shown in Expression (9), it suffices that the discrete value Y is uniquely decided with respect to the input value X, and even when the discrete value Y is a floating point number, the embodiment of the present invention can be applied.

[Expression 9]

$$Y=(\text{int})(\text{func}(X))+0.45 \qquad (9)$$

Furthermore, as described above, as it suffices that the discrete value Y is uniquely decided with respect to the input value X, a plurality of ranges of the input value X which takes the discrete value Y may be prepared.

Also, the embodiment of the present invention may be applied to the range whose occurrence rate for the computation processing of converting the input value X into the discrete value Y is high, and the computation represented by Expression (8) may be simply performed on the other ranges.

Furthermore, in the above, the range of the input value X which takes the discrete value Y is previously calculated. However, for example, in a case where the range of the input value X which takes the discrete value Y is changed during the processing for converting the input value X into the discrete value Y, the range of the input value X may be appropriately calculated again.

Configuration Example of a Computation Apparatus

Now, with reference to a block diagram of FIG. 16, a description will be provided on a computation apparatus configured to apply a computation based on a predetermined nonlinear function func(X) on the input value X and output a discrete value Y.

A computation apparatus 401 of FIG. 16 is composed of a range table creation unit 431 and a search conversion unit 432.

The range table creation unit 431 sequentially changes the input value X, for example, on the basis of Expression (8) described above to create the range table in which the input value X when the discrete value Y is changed corresponds to the discrete value Y at that time and supplies the range table to the search conversion unit 432.

The search conversion unit 432 is provided with a search unit 432*a* and a decision unit 432*b*. The search unit 432*a* searches for the range in which the input value is included in the range table supplied from the range table creation unit 431. The decision unit 432*b* decides the discrete value corresponding to the range searched for by the search unit 432*a* and outputs the discrete value to the external apparatus.

Range Table Creation Processing by the Computation Apparatus

Figure 17:
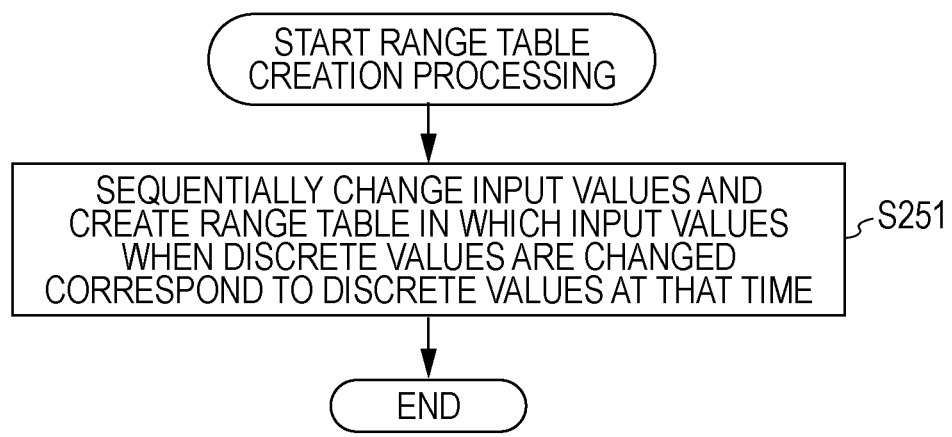
FIG. 17 is a flow chart for describing a range creation processing by the computation apparatus of FIG. 16.

Next, with reference to a flow chart of FIG. 17, the range table creation processing by the computation apparatus 401 of FIG. 16 will be described. In the computation apparatus 401, the range table creation processing is carried out before a discrete value search processing is performed.

In step S251, the range table creation unit 431 sequentially changes the input value X, for example, on the basis of Expression (8) described above to create the range table in which the input value X when the discrete value Y is changed corresponds to the discrete value Y at that time and supplies the range table to the search conversion unit 432.

As the result of the above-mentioned processing, before the discrete value output processing is carried out, it is possible to create the range table in which the ranges of the input values correspond to the discrete values.

Discrete Value Search Processing by the Computation Apparatus

Figure 18:
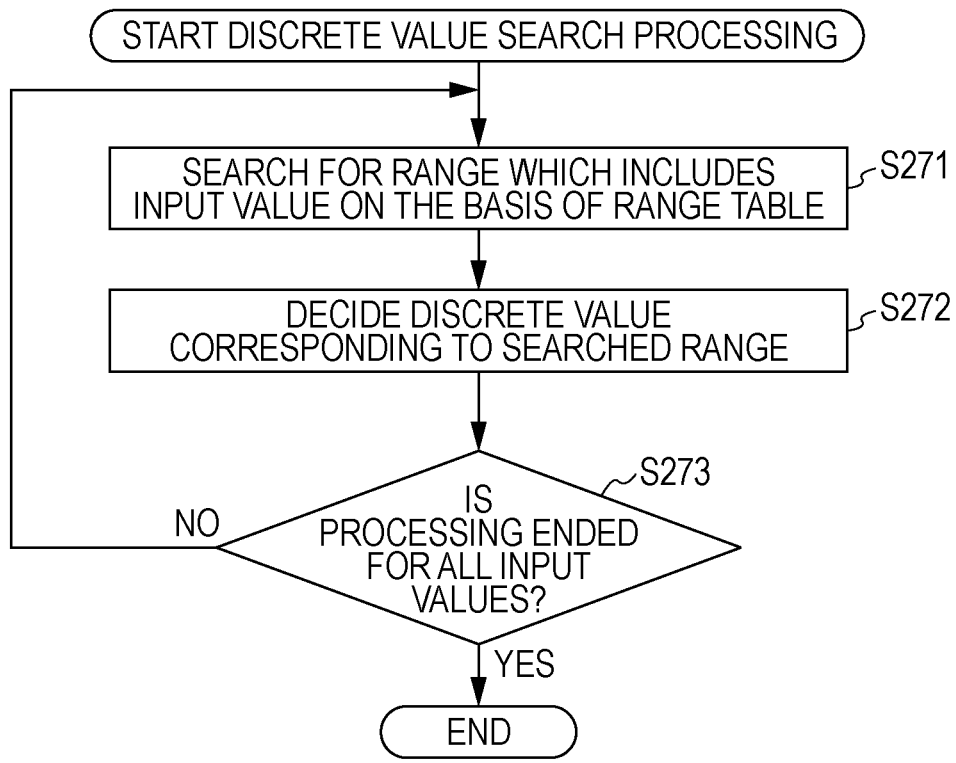
FIG. 18 is a flow chart for describing a discrete value search processing by the computation apparatus of FIG. 16.

Next, with reference to a flow chart of FIG. 18, the discrete value search processing by the computation apparatus 401 of FIG. 16 will be described.

In step S271, the search unit 432*a* of the search conversion unit 432 searches for the range in which the input value is included in the range table supplied from the range table creation unit 431.

In step S272, the decision unit 432*b* of the search conversion unit 432 decides the discrete value corresponding to the range searched for by the search unit 432*a* and outputs the discrete value to the external apparatus.

In step S273, the search conversion unit 432 determines whether or not the processing of searching for the discrete value is ended with respect to all the input values. In a case where it is determined that the processing of deciding the discrete value is not ended with respect to all the input values, the processing is returned to step S271, and until the processing is ended with respect to all the input values, the processing in steps S271 to S273 is repeatedly performed.

As the result of the above-mentioned processing, on the basis of the range of the input value corresponding to the previously obtained discrete value, it is possible to decide the discrete value corresponding to the input value. Therefore, for example, without computing func(X) which is the nonlinear function, the discrete value can be decided through the search by using the range table, and it is thus possible to perform the nonlinear computation processing more efficiently.

It should be noted that the computation apparatus 401 of FIG. 16 has one range table in which with respect to one input value X, the range in which the input value is included corresponds to the discrete value Y. However, the computation apparatus 401 can have a plurality of range tables respectively in which the range of the input value corresponds to the discrete value Y for each type of the input values. That is, the computation apparatus 401 reads out the corresponding range table in accordance with the information indicating the type of the input value, the address, and the like, and uses the read range table, so that the discrete value corresponding to the range of the input value can be output.

As a result, with respect to the input values of a plurality of types, even in a case where the respective discrete values are output, by reading out the range table in accordance with the type of the input value, it is possible to output the discrete values of a plurality of types by only using one computation apparatus.

The above-mentioned series of processings including a list display processing can be executed by using hardware and also executed by using software. In a case where the above-mentioned series of processings is executed by using the software, a program constituting the software is installed from the recording media, for example, to a computer incorporated in dedicated-use hardware or a general-use personal computer or the like which can execute various functions by installing various programs, and the like.

Figure 19:
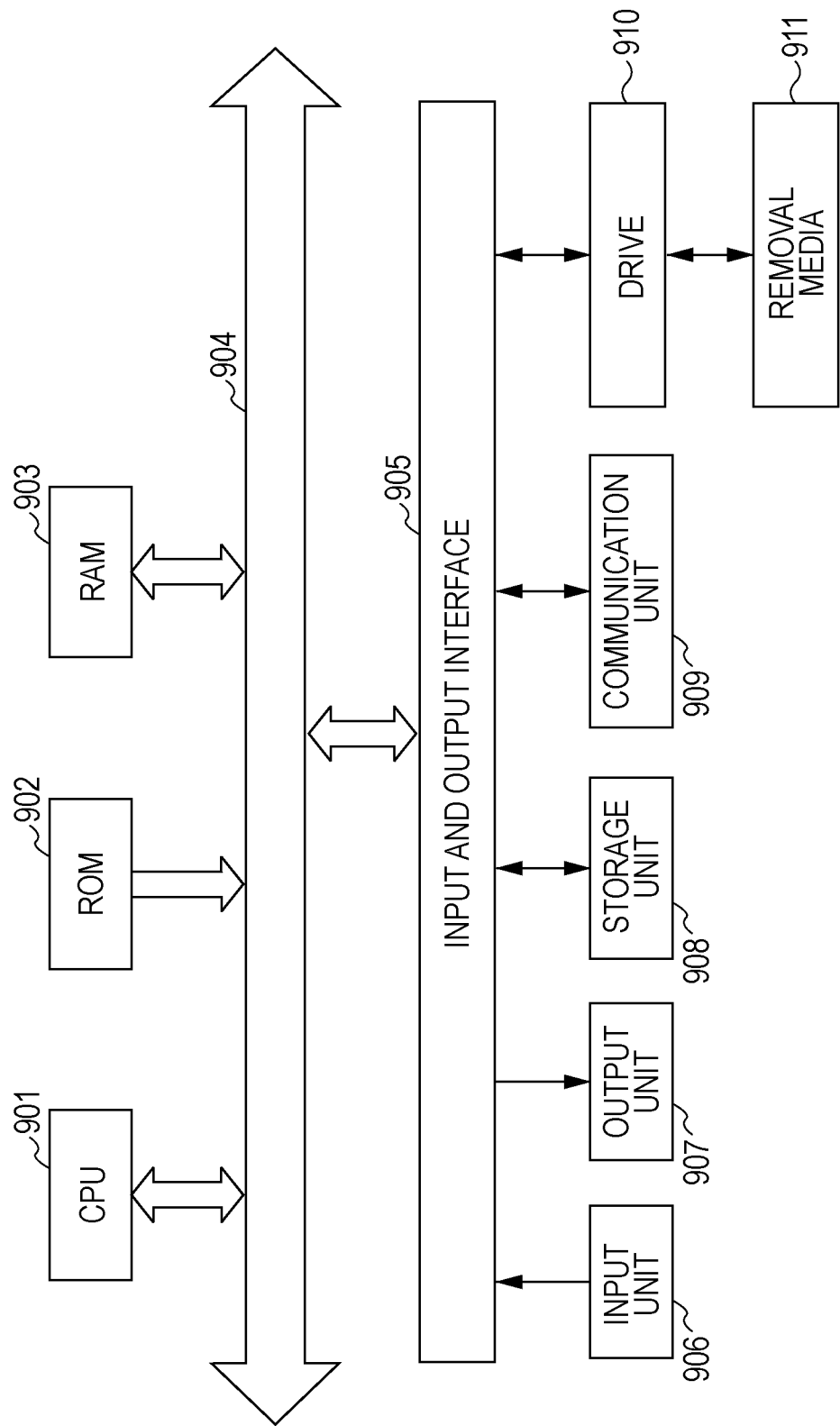
FIG. 19 is a block diagram of a configuration example of a personal computer.

FIG. 19 is a block diagram showing a configuration example of the hardware of the computer which executes the above-mentioned series of processings by way of the program.

In the computer, a CPU (Central Processing Unit) 901, a ROM (Read Only Memory) 902, and a RAM (Random Access Memory) 903 are mutually connected by the bus 904.

Furthermore, an input and output interface 905 is connected to the bus 904. To the input and output interface 905, an input unit 906 composed of a key board, a mouse, and the like, an output unit 907 composed of a display, a speaker, and the like, a storage unit 908 composed of a hard disk, a non-volatile memory, and the like, a communication unit 909 composed of a network interface, and a drive 910 configured to drive removal media 911 composed of a magnetic disk, an optical disk, an opto-magnetic disk, a semiconductor memory, and the like are connected.

In the computer configured in the above-mentioned manner, the CPU 901 loads, for example, the program stored on the storage unit 908 onto the RAM 903 via the input and output interface 905 and the bus 904 and executes the program, so that the above-mentioned series of processings are performed.

The program executed by the computer (the CPU 901) is provided while being recorded, for example, on the removal media 911 which is package media composed of the magnetic disk (including a flexible disk), the optical disk (including a CD-ROM (Compact Disc-Read Only Memory), a DVD (Digital Versatile Disc) or the like), the opto-magnetic disk, the semiconductor memory, or the like, or provided via a wired or wireless transmission medium such as a local area network, the internet, or digital satellite broadcasting.

Then, by mounting the removal media 911 to the drive 910, the program can be installed to the storage unit 908 via the input and output interface 905. Also, the program can be received via the wired or wireless transmission medium by the communication unit 909 and installed to the storage unit 908. In addition, the program can be previously installed to the ROM 902 or the storage unit 908.

It should be noted that the program executed by the computer may be a program in which the processings are executed in a time series manner in the stated order in the present specification or may also be a program in which the processings are executed in a parallel manner or at an appropriate timing when, for example, a call is carried out.

The present application contains subject matter related to that disclosed in Japanese Priority Patent Application JP 2008-247683 filed in the Japan Patent Office on Sep. 26, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A computation apparatus comprising:
range table creation means configured to create a range table that maps each one of a first plurality of ranges of input values for one or more audio signals to a corresponding discrete value, the corresponding discrete value being a computation result obtained by applying a nonlinear computation on at least one input value in the one of the first plurality of ranges of input values for the one or more audio signals; and
search means configured to search, when an input value for an input audio signal is input, in the range table for a range in which the input value is included and output a discrete value corresponding to the searched range, wherein the first plurality of ranges comprises a selected second plurality of ranges, wherein each range of the second plurality of ranges corresponds to at least one first discrete value the output occurrence rate of which is higher than a selected occurrence rate, and wherein the search means is configured to:
determine, without using a hash table, whether the input value is included in any one of the selected second plurality of ranges;
if it is determined that the input value is in one of the selected second plurality of ranges, output a discrete value corresponding to the one of the selected second plurality of ranges; and
if it is determined that the input value is not in any one of the selected second plurality of ranges and thereby corresponds to a second discrete value having an output occurrence rate lower than the selected occurrence rate, determine an initial range in the first plurality of ranges using the hash table and search for the range in which the input value is included based at least in part on the initial range and the range table.

2. The computation apparatus according to claim 1, further comprising:
hash table creation means configured to create the hash table based at least in part on the range table.

3. The computation apparatus according to claim 2,
wherein the hash table creation means is configured to create the hash table at least in part by using at least one value selected from a group consisting of: an exponent part and a significant part of the input value which decides the range in the range table.

4. The computation apparatus according to claim 1,
wherein the search means is further configured to perform a binary search of the range table for the range in which the input value is included.

5. A computation method comprising acts of:
creating a range table that maps each one of a first plurality of ranges of input values for one or more audio signals to a corresponding discrete value, the corresponding discrete value being a computation result obtained by applying a nonlinear computation on at least one input value in the one of the first plurality of ranges of input values for the one or more audio signals;
storing the range table in at least one recording medium; and
reading the range table from the at least one recording medium and, when an input value for an input audio signal is input, using at least one processor to search in the range table for a range in which the input value is included and outputting a discrete value corresponding to the searched range, wherein the first plurality of ranges comprises a selected second plurality of ranges, wherein each range of the second plurality of ranges corresponds to at least one first discrete value the output occurrence rate of which is higher than a selected occurrence rate, and wherein the computation method further comprises:
determining, without using a hash table, whether the input value is included in any one of the selected second plurality of ranges;
if it is determined that the input value is in one of the selected second plurality of ranges, outputting a discrete value corresponding to the one of the selected second plurality of ranges; and if it is determined that the input value is not in any one of the selected second plurality of ranges and thereby corresponds to a second discrete value having an output occurrence rate lower than the selected occurrence rate, determining an initial range in the first plurality of ranges using the hash table and searching for the range in which the input value is included based at least in part on the initial range and the range table.

6. At least one non-transitory storage device having encoded there on a program for instructing a computer to execute a processing comprising acts of:

creating a range table that maps each one of a first plurality of ranges of input values for one or more audio signals to a corresponding discrete value, the corresponding discrete value being a computation result obtained by applying a nonlinear computation on at least one input value in the one of the first plurality of ranges of input values for the one or more audio signals; and searching, when an input value for an input audio signal is input, in the range table for a range in which the input value is included and outputting a discrete value corresponding to the searched range, wherein the first plurality of ranges comprises a selected second plurality of ranges, wherein each range of the second plurality of ranges corresponds to at least one first discrete value the output occurrence rate of which is higher than a selected occurrence rate, and wherein the processing further comprises:

determining, without using a hash table, whether the input value is included in any one of the selected second plurality of ranges;

if it is determined that the input value is in one of the selected second plurality of ranges, outputting a discrete value corresponding to the one of the selected second plurality of ranges; and if it is determined that the input value is not in any one of the selected second plurality of ranges and thereby corresponds to a second discrete value having an output occurrence rate lower than the selected occurrence rate, determining an initial range in the first plurality of ranges using the hash table and searching for the range in which the input value is included based at least in part on the initial range and the range table.

7. A quantization apparatus comprising:

range table creation means configured to create a table that maps each one of a first plurality of ranges of input values for one or more audio signals to a corresponding quantized value, the corresponding quantized value being a computation result obtained by applying a nonlinear computation on at least one input value in the one of the first plurality of ranges of input values for the one or more audio signals; and search means configured to search, when an input value for an input audio signal is input, in the range table for a range in which the input value is included and output a quantized value corresponding to the searched range, wherein the first plurality of ranges comprises a selected second plurality of ranges, wherein each range of the second plurality of ranges corresponds to at least one first quantized value the output occurrence rate of which is higher than a selected occurrence rate, and wherein the search means is configured to:

determine, without using a hash table, whether the input value is included in any one of the selected second plurality of ranges;

if it is determined that the input value is in one of the selected second plurality of ranges, output a quantized value corresponding to the one of the selected second plurality of ranges; and if it is determined that the input value is not in any one of the selected second plurality of ranges and thereby corresponds to a second quantized value having an output occurrence rate lower than the selected occurrence rate, determine an initial range in the first plurality of ranges using the hash table and search for the range in which the input value is included based at least in part on the initial range and the range table.

8. A quantization method comprising acts of:

creating a range table that maps each one of a first plurality of ranges of input values for one or more audio signals to a corresponding quantized value, the corresponding quantized value being a computation result obtained by applying a nonlinear computation on at least one input value in the one of the first plurality of ranges of input values for the one or more audio signals;

storing the range table in at least one recording medium; and reading the range table from the at least one recording medium and, when an input value for an input audio signal is input, using at least one processor to search in the range table for a range in which the input value is included and output a quantized value corresponding to the searched range, wherein the first plurality of ranges comprises a selected second plurality of ranges, wherein each range of the second plurality of ranges corresponds to at least one first quantized value the output occurrence rate of which is higher than a selected occurrence rate, and wherein the computation method further comprises:

determining, without using a hash table, whether the input value is included in any one of the selected second plurality of ranges;

if it is determined that the input value is in one of the selected second plurality of ranges, outputting a quantized value corresponding to the one of the selected second plurality of ranges; and if it is determined that the input value is not in any one of the selected second plurality of ranges and thereby corresponds to a second quantized value having an output occurrence rate lower than the selected occurrence rate, determining an initial range in the first plurality of ranges using the hash table and searching for the range in which the input value is included based at least in part on the initial range and the range table.

9. At least one non-transitory storage device having encoded there on a program for instructing a computer to execute a processing comprising acts of:

creating a range table that maps each one of a first plurality of ranges of input values for one or more audio signals to a corresponding quantized value, the corresponding quantized value being a computation result obtained by applying a nonlinear computation on at least one input value in the one of the first plurality of ranges of input values for the one or more audio signals; and searching, when an input value for an input audio signal is input, in the range table for a range in which the input value is included and output a quantized value corresponding to the searched range, wherein the first plurality of ranges comprises a selected second plurality of ranges, wherein each range of the second plurality of ranges corresponds to at least one first quantized value the output occurrence rate of which is higher than a selected occurrence rate, and wherein the processing further comprises:

determining, without using a hash table, whether the input value is included in any one of the selected second plurality of ranges;

if it is determined that the input value is in one of the selected second plurality of ranges, outputting a quantized value corresponding to the one of the selected second plurality of ranges; and if it is determined that the input value is not in any one of the selected second plurality of ranges and thereby corresponds to a second quantized value having an output occurrence rate lower than the selected occurrence rate, determining an initial range in the first plurality of ranges using the hash table and searching for the range in which the input value is included based at least in part on the initial range and the range table.

10. A computation apparatus comprising at least one processor configured to:

create a range table that maps each one of a first plurality of ranges of input values for one or more audio signals to a corresponding discrete value, the corresponding discrete value being a computation result obtained by applying a nonlinear computation on at least one input value in the one of the first plurality of ranges of input values for the one or more audio signals;

store the range table in at least one storage device; and search, when an input value for an input audio signal is input, in the range table for a range in which the input value is included and output a discrete value corresponding to the searched range, wherein the first plurality of ranges comprises a selected second plurality of ranges, wherein each range of the second plurality of ranges corresponds to at least one first quantized value the output occurrence rate of which is higher than a selected occurrence rate, and wherein the at least one processor is further configured to:

determine, without using a hash table, whether the input value is included in any one of the selected second plurality of ranges;

if it is determined that the input value is in one of the selected second plurality of ranges, output a discrete value corresponding to the one of the selected second plurality of ranges; and if it is determined that the input value is not in any one of the selected second plurality of ranges and thereby corresponds to a second discrete value having an output occurrence rate lower than the selected occurrence rate, determine an initial range in the first plurality of ranges using the hash table and search for the range in which the input value is included based at least in part on the initial range and the range table.

11. A quantization apparatus comprising at least one processor configured to:

create a range table that maps each one of a first plurality of ranges of input values for one or more audio signals to a corresponding quantized value, the corresponding quantized value being a computation result obtained by applying a nonlinear computation on at least one input value in the one of the first plurality of ranges of input values for the one or more audio signals;

store the range table in at least one storage device; and search, when an input value for an input audio signal is input, in the range table for a range in which the input value is included and output a quantized value corresponding to the searched range, wherein the first plurality of ranges comprises a selected second plurality of ranges, wherein each range of the second plurality of ranges corresponds to at least one first quantized value the output occurrence rate of which is higher than a selected occurrence rate, and wherein the at least one processor is further configured to:

determine, without using a hash table, whether the input value is included in any one of the selected second plurality of ranges;

if it is determined that the input value is in one of the selected second plurality of ranges, output a quantized value corresponding to the one of the selected second plurality of ranges; and if it is determined that the input value is not in any one of the selected second plurality of ranges and thereby corresponds to a second quantized value having an output occurrence rate lower than the selected occurrence rate, determine an initial range in the first plurality of ranges using the hash table and search for the range in which the input value is included based at least in part on the initial range and the range table.

* * * * *